United States Patent
Cadugan et al.

(10) Patent No.: US 11,217,718 B2
(45) Date of Patent: Jan. 4, 2022

(54) PHOTODETECTOR WITH A BURIED LAYER

(71) Applicant: Allegro MicroSystems, LLC, Manchester, NH (US)

(72) Inventors: Bryan Cadugan, Bedford, NH (US); Harianto Wong, Southborough, MA (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/740,816

(22) Filed: Jan. 13, 2020

(65) Prior Publication Data
US 2020/0259033 A1   Aug. 13, 2020

Related U.S. Application Data

(63) Continuation-in-part of application No. 16/272,005, filed on Feb. 11, 2019.

(51) Int. Cl.
| | |
|---|---|
| *H01L 31/102* | (2006.01) |
| *H01L 31/18* | (2006.01) |
| *H01L 31/0224* | (2006.01) |

(52) U.S. Cl.
CPC .... *H01L 31/102* (2013.01); *H01L 31/022408* (2013.01); *H01L 31/1804* (2013.01); *H01L 31/1844* (2013.01)

(58) Field of Classification Search
CPC ............... H01L 31/102; H01L 31/1844; H01L 31/1804; H01L 31/022408; H01L 31/0352; H01L 31/107; H01L /
See application file for complete search history.

(56) References Cited

U.S. PATENT DOCUMENTS

| | | |
|---|---|---|
| 4,264,382 A | 4/1981 | Anantha et al. |
| 6,020,623 A | 2/2000 | Chiozzi |
| 6,034,413 A | 3/2000 | Hastings et al. |
| (Continued) | | |

OTHER PUBLICATIONS

U.S. Final Office Action dated Oct. 28, 2020 for U.S. Appl. No. 16/272,005; 14 Pages.
U.S. Non-Final Office Action dated May 14, 2020 for U.S. Appl. No. 16/272,005; 12 Pages.
(Continued)

*Primary Examiner* — Julia Slutsker
(74) *Attorney, Agent, or Firm* — Daly, Crowley, Mofford & Durkee, LLP

(57) ABSTRACT

According to an embodiment of the present disclosure, a photodetector device can include a substrate layer; a bottom contacting layer disposed over a surface of the substrate layer and having a first contacting region and a second contacting region, the bottom contacting layer providing a low resistance path between the first and second contacting regions; an insulating layer disposed over a surface of the bottom contacting layer; an intrinsic region disposed within the insulating layer, the intrinsic region in electrical contact with the first contacting region of the bottom contacting layer, the intrinsic region comprising a low band-gap material; a metal contact disposed within the insulating layer and in electrical contact with the second contacting region of the bottom contacting layer; an anode in electrical contact with the intrinsic region; and a cathode in electrical contact with the metal contact.

19 Claims, 17 Drawing Sheets

(56) References Cited

U.S. PATENT DOCUMENTS

| | | | |
|---|---|---|---|
| 6,828,644 B2 | 12/2004 | Asano et al. | |
| 7,397,101 B1 | 7/2008 | Masini et al. | |
| 8,384,183 B2 | 2/2013 | Wong et al. | |
| 9,099,638 B2 | 8/2015 | Wang et al. | |
| 9,312,473 B2 | 4/2016 | Kosier et al. | |
| 9,548,443 B2 | 1/2017 | Wang | |
| 2004/0173875 A1 | 9/2004 | Yamamoto et al. | |
| 2005/0184354 A1* | 8/2005 | Chu | H01L 31/101 257/458 |
| 2007/0170537 A1 | 7/2007 | Poenar et al. | |
| 2008/0083963 A1* | 4/2008 | Hsu | H01L 27/1446 257/431 |
| 2019/0288132 A1* | 9/2019 | Wang | H01L 31/0232 |
| 2020/0259026 A1 | 8/2020 | Cadugan et al. | |
| 2020/0259038 A1* | 8/2020 | Natsuaki | H01L 31/107 |

OTHER PUBLICATIONS

Lee, et al. "A miniaturized high-voltage solar cell array as an electrostatic MEMS power supply;" Journal of Microelectromechanical Systems; vol. 4, Issue 3; Sep. 1995; 7 Pages.

Response to U.S. Non-Final Office Action dated May 14, 2020 for U.S. Appl. No. 16/272,005; Response filed Aug. 14, 2020; 17 Pages.

U.S. Non-Final Office Action dated Mar. 17, 2021 for U.S. Appl. No. 16/272,005; 13 pages.

Response to Final Office Action dated Oct. 28, 2020 for U.S. Appl. No. 16/272,005; Response filed on Jan. 25, 2021; 9 pages.

Response to U.S. Non-Final Office Action dated Mar. 17, 2021 for U.S. Appl. No. 16/272,005; Response filed on Jun. 17, 2021; 10 pages.

U.S. Final Office Action dated Jul. 7, 2021 for U.S. Appl. No. 16/272,005; 11 pages.

Non-Final Office Action dated Oct. 26, 2021 for U.S. Appl. No. 16/272,005, 12 Pages.

* cited by examiner

PHOTODETECTOR WITH A BURIED LAYER

CROSS REFERENCE TO RELATED APPLICATIONS

This application is a continuation-in-part application of U.S. patent application Ser. No. 16/272,005 filed on Feb. 11, 2019, which application is hereby incorporated by reference in its entirety.

BACKGROUND

As is known in the art, there are two conventional approaches to create a Photodiode (or Silicon Photodiode). The first approach is using a vertical process that requires a top and bottom contact and allows for a thick vertical region to improve the PDE (Photon Detection Efficiency). A limitation of the first approach is that it does not allow for CMOS (Complementary metal-oxide-semiconductor) integration or multipixel designs on one die. The other approach is a CMOS compatible process that allows for good, inexpensive integration. However, the second approach does not allow for a very thick vertical region causing PDE to be sacrificed.

SUMMARY

In accordance with the concepts, techniques and systems described herein is an efficient method for creating a photodetector using an epitaxial (EPI) growth and buried layer process.

According to one illustrative embodiment, an electronics module assembly may include: a substrate layer; a buried layer deposited upon a first surface area of the substrate layer; an intrinsic layer deposited upon a first portion of a first surface area of the buried layer; a plug layer deposited upon a second portion of the first surface area of the buried layer; a p-plus layer deposited upon a first surface area of the intrinsic layer; an n-plus layer deposited upon a first surface area of the plug layer; a pre-metal dielectric (PMD) layer deposited upon the p-plus layer and n-plus layer; a first node coupled, through the PMD layer, to the p-plus layer; and a second node coupled, through the PMD layer, to the n-plus layer.

In one aspect, the electronics module assembly may further include one or more trenches spanning multiple layers from the PMD layer to the buried layer at outer sides of the p-plus layer and n-plus layer. Herein, one of the one or more trenches may be located between the p-plus layer and n-plus layer.

In one aspect, the substrate layer may comprise a p-type substrate.

In one aspect, the buried layer may comprise an n-type buried layer (NBL).

In one aspect, the electronics module assembly may further include an n-type epitaxial (N-EPI) layer deposited between the first surface area of the intrinsic area and a second surface area of the p-plus layer, wherein the intrinsic layer comprises a material other than epitaxial (EPI).

In one aspect, a portion of a surface area of the PMD layer may be configured to receive a photon.

In one aspect, a portion of a second surface area of the substrate layer may be configured to receive a photon.

In one aspect, the plug layer may puncture the buried layer.

In one aspect, more than one electronics module assemblies may form an array comprising the more than one electronics module assemblies.

According to another illustrative embodiment, a method for forming an electronics module assembly may include: depositing a buried layer upon a first surface area of a substrate layer; depositing an intrinsic layer upon a first portion of a first surface area of the buried layer; depositing a plug layer upon a second portion of the first surface area of the buried layer; depositing a p-plus layer upon a first surface area of the intrinsic layer; depositing an n-plus layer upon a first surface area of the plug layer; depositing a pre-metal dielectric (PMD) layer upon the p-plus and n-plus layer; coupling a voltage node, through the PMD layer, to the p-plus layer; and coupling a ground node, through the PMD layer, to the n-plus layer.

In one aspect, the method may further include forming a portion of a surface area of the PMD layer to receive a photon.

In one aspect, the method may further include forming a portion of a second surface area of the substrate layer to receive a photon.

In one aspect, the method may further include implanting one or more trenches at outer sides of the p-plus layer and n-plus layer, each of the more than one trench spanning multiple layers from the PMD layer to the buried layer. Herein, one of the one or more trenches may be located between the p-plus layer and n-plus layer.

In one aspect, the method may further include depositing an n-type epitaxial (N-EPI) layer between the first surface area of the intrinsic area and a second surface area of the p-plus layer, wherein the intrinsic layer comprises a material other than epitaxial (EPI).

In one aspect, the plug layer may puncture the buried layer.

In one aspect, the method may further include forming an array of electronics module assemblies using more than one electronics module assemblies.

According to another illustrative embodiment, a photodetector device can include: a substrate layer; a bottom contacting layer disposed over a surface of the substrate layer and having a first contacting region and a second contacting region, the bottom contacting layer providing a low resistance path between the first and second contacting regions; an insulating layer disposed over a surface of the bottom contacting layer; an intrinsic region disposed within the insulating layer, the intrinsic region in electrical contact with the first contacting region of the bottom contacting layer, the intrinsic region comprising a low band-gap material; a metal contact disposed within the insulating layer and in electrical contact with the second contacting region of the bottom contacting layer; an anode in electrical contact with the intrinsic region; and a cathode in electrical contact with the metal contact.

In one aspect, the low band-gap material may inlcude Germanium (Ge), Silicon-Germanium (SiGe), or Indium Gallium Arsenide (InGaAs). In one aspect, the insulating layer can include an oxide. In one aspect, the intrinsic region may be formed within an etched cavity of the insulating layer and the device can include a seed layer disposed over one or more surfaces of the etched cavity. In one aspect, the seed layer can have a crystalline structure compatible with the low band-gap material.

In one aspect, the device may include an encapsulating layer disposed over a surface of the insulating layer; a first plug disposed within the encapsulating layer and providing electrical contact between the anode and the intrinsic region; a second plug disposed within the encapsulating layer and providing electrical contact between the cathode and the meta contact. In one aspect, the first and second plugs can include Tungsten (W). In one aspect, the anode can entirely cover a surface of the intrinsic region. In one aspect, the anode may partially covers a surface of the intrinsic region.

In one aspect, the device can include an n-type buried layer (NBL) implanted into the substrate layer. The bottom contacting layer can include: an epitaxial (EPI) layer disposed over the surface of the substrate layer and a surface of the NBL; a first plug implanted into the EPI layer, the first plug in electrical contact with the NBL, the first plug corresponding to the first contacting region; and a second plug implanted into the EPI layer, the second plug in electrical contact with the NBL, the second plug corresponding to the second contacting region.

In one aspect, the first and send plugs can include a doped N-type material. In one aspect, the bottom contacting layer can include: an epitaxial (EPI) layer disposed over the surface of the substrate layer; and a low-resistance heavily doped N-type or P-type region disposed within the EPI layer and in electrical contact with the intrinsic region and the metal contact.

In one aspect, the bottom contacting layer may include: an epitaxial (EPI) layer disposed over the surface of the substrate layer; a metal region disposed within the EPI layer; a first plug disposed over a surface of the metal region and corresponding to the first contacting region; and a second plug disposed over the surface of the metal region and corresponding to the second contacting region.

According to another illustrative embodiment, a method for forming a photodetector device can include: forming a bottom contacting layer over a surface of a substrate layer, the bottom contacting region having a first contacting region and a second contacting region, the bottom contacting layer providing a low resistance path between the first and second contacting regions; depositing an insulating layer over a surface of the bottom contacting layer; etching a cavity within the insulating layer; depositing a low band-gap material in the etched cavity of the insulating layer to form an intrinsic region, the intrinsic region in electrical contact with the first contacting region of the bottom contacting layer; forming a metal contact in the insulating layer, the metal contact in electrical contact with the second contacting region of the bottom contacting layer; forming an anode to be in electrical contact with the intrinsic region; and forming a cathode to be in electrical contact with the metal contact.

In one aspect, the low band-gap material can include Germanium (Ge), Silicon-Germanium (SiGe), or Indium Gallium Arsenide (InGaAs). In one aspect, the insulating layer may include an oxide. In one aspect, the method can include depositing a seed layer over one or more surfaces of the etched region of the insulating layer before depositing a low band-gap material. In one aspect, the seed layer can have a crystalline structure compatible with the low band-gap material.

In one aspect, the method can include: forming an encapsulating layer over a surface of the insulating layer; forming a first plug in the encapsulating layer to provide electrical contact between the anode and the intrinsic region; forming a second plug in the encapsulating layer to provide electrical contact between the cathode and the metal contact. In one aspect, the first and second plugs can include Tungsten (W).

According to another illustrative embodiment, a method for forming a photodetector device can include: forming a bottom contacting layer over a surface of a substrate layer, the bottom contacting region having a first contacting region and a second contacting region, the bottom contacting layer providing a low resistance path between the first and second contacting regions; forming a photo-responsive layer by depositing a low band-gap material over the bottom contacting layer; etching a first metal contact in the photo-responsive layer, the first metal contact in electrical contact with the first contacting region of the bottom contacting layer; etching a second metal contact in the photo-responsive layer, the second metal contact in electrical contact with the second contacting region of the bottom contacting layer; forming an anode to be in electrical contact with the first metal contact; and forming a cathode to be in electrical contact with the second metal contact.

The details of one or more embodiments of the disclosure are outlined in the accompanying drawings and the description below. Other features, objects, and advantages of the disclosure will be apparent from the description and drawings, and the claims.

BRIEF DESCRIPTION OF THE DRAWINGS

The foregoing features may be more fully understood from the following description of the drawings in which.

DETAILED DESCRIPTION

Figure 1:
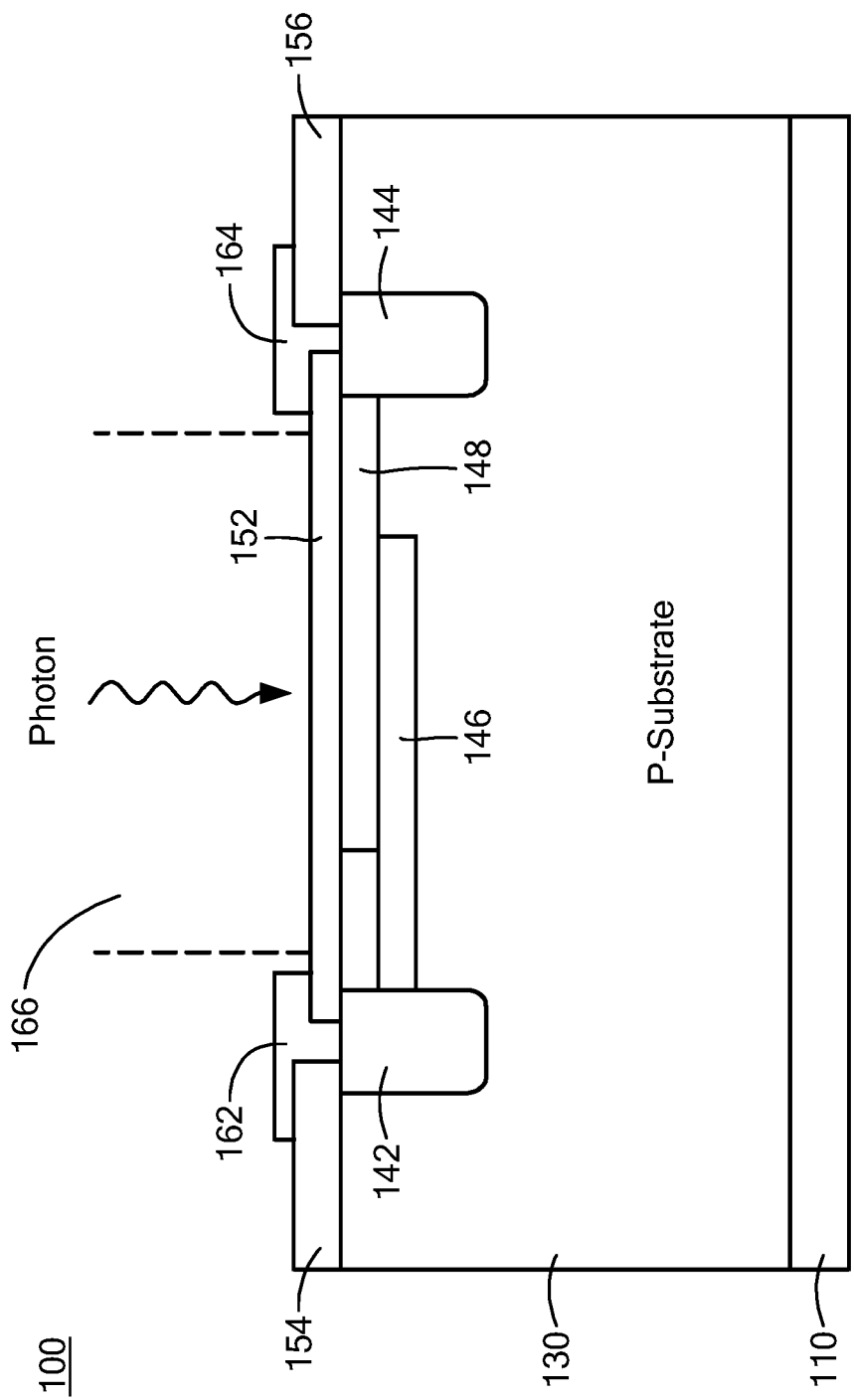
FIG. 1 is a block diagram of a conventional Single Photon Avalanche Photo Diode (SPAD) as an example of a Photodiode.

Relative descriptions herein, such as left, right, up, and down, are with reference to the figures, are merely relative and not meant in a limiting sense. Unless otherwise specified, the illustrated embodiments may be understood as providing illustrative features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

Certain introductory concepts and terms used in the specification are collected here.

As used herein, the term "Photodetector" is used to describe a part or device that detects a photon from gain generated by electron-hole pairs from the photon. The photodetector may comprise a PIN (Ptype/Intrinsic/Ntype) Photodiode, APD (Avalanche photodiode) or SPAD (Single Photon Avalanche Photo Diode). Herein, the term APD or SPAD is used to describe a silicon-based semiconductor that provides gain by the generation of electron-hole pairs from a photon. The electron-hole pairs create an "avalanche" of electrons in a substrate. The diode conventionally contains a pn junction comprising a positively doped p-region and a negatively doped n-region, where a depletion region exists between the p-region and n-region. The APD is biased near breakdown and receives an avalanche multiplier. The SPAD is biased above breakdown and triggers the short duration relatively large avalanche current. The PIN Photodiode gets a mild bias and no avalanche amplification.

As used herein, the term "substrate" is used to describe any type of structure with a flat surface upon which semiconductor materials can be deposited and/or into which semiconductor materials can be implanted and/or diffused. In some embodiments, the substrate is a P-type silicon substrate having a particular range of concentrations of P-type atoms (i.e., ions).

As used herein, the term "epi" is used to refer to an epitaxial layer, for example, an N-type epitaxial layer, disposed over a substrate, for example, a P-type substrate, and having a particular range of concentrations of N-type atoms (i.e., ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e., ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after the PBL implant and diffusion steps, and the upward diffusion into the epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after the NBL implant and diffusion steps, and the upward diffusion into the epi layer can be performed during a field oxidation process.

As used herein, the term "plug" is used to refer to a low resistance vertical connection between different layers in the multilevel interconnect scheme. Tungsten (W) may be used for this purpose, but other suitable materials can be used.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e., ions).

Referring now to FIG. 1, a diagram showing a conventional structure of Single Photon Avalanche Photo Diode (SPAD). A photon entering the SPAD 100 may pass through a silicon dioxide layer 152. In some embodiments, the SPAD may have an anti-reflecting coating. The photon then reaches an n layer 148 and an upper p layer 146 where the photon excites free electrons and holes. The electrons and holes then move up to an anode 162 and a cathode 164. The region of the optimal creation of electron/hole pairs occurs in a depletion region 146/148. However, the thin depletion region is less efficient for the detection of long wavelength light. The wavelength of the photon is commonly 905 nm. For photons with 905 nm wavelength, the Photon Detection Efficiency (PDE) is less than <2% for a CMOS compatible process.

Figure 2:
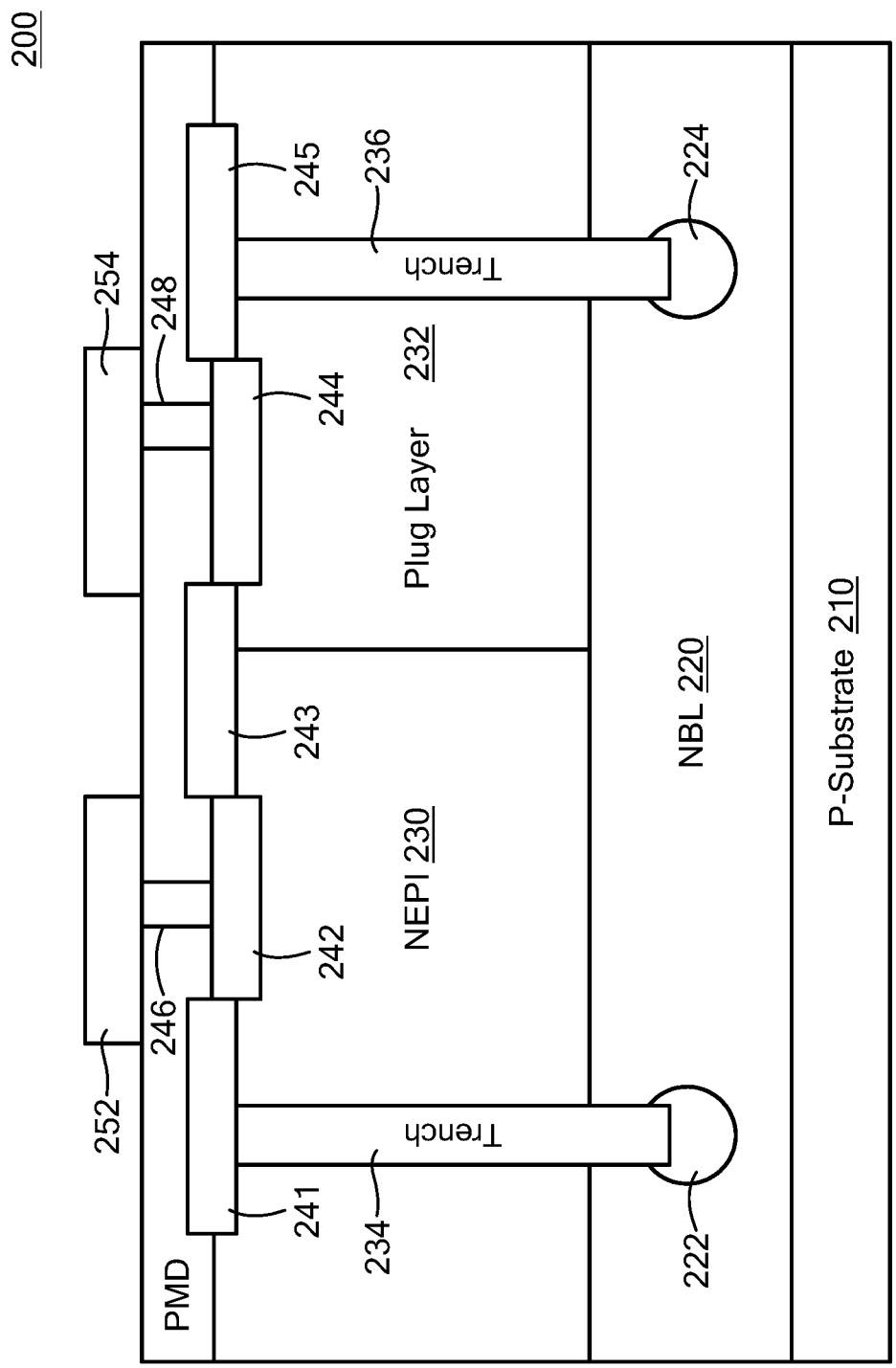
FIG. 2 is a diagram showing an illustrative CMOS device built with a buried layer process.

Referring now to FIG. 2, a diagram showing an illustrative device built with a buried layer process is presented. The technology of the buried layer process is described, for example, in U.S. Pat. Nos. 5,514,901 and 5,545,917. The buried layer process may include, but is not limited to, these steps: 1) a standard p-substrate has "buried" layers—N-type or P-type disposed on the p-substrate; 2) an EPI layer is grown, effectively burying the buried layers; and 3) a plug layer can be implanted and driven to connect buried layers to top layers, this plug layer is commonly an N-type, but can be P-type as well. By using the buried layer process, a very highly doped lower layer would be connected to the top layer, for example, a Voltage at the Common Collector (VCC) node on the top layer, through the plug layer, which may be heavily doped and diffuses up and down through the EPI layer.

The illustrative device 200 may be a BCD (Bipolar-CMOS-DMOS, or BCD) device.

The device 200 may comprise a P-type silicon substrate (or p-substrate) 210. On a surface of the p-substrate, an N-type buried layer or NBL 220 is implanted. Over the NBL, an N-type EPI layer (or N-EPI) 230 may be grown next to an implanted plug layer. The device may have an anode 252 and cathode 254 to interface with other modules. Through the anode 252, current flows into the device from outside, and through the cathode 254, current flows out from the device. The anode 252 may be connected by metal 246 to a P-type plus (or p-plus) region 242. The p-plus region is deposited on top of N-EPI 230. In some embodiments, the p-plus region 242 may be highly doped, and the N-EPI layer 230 may be weakly doped. In other embodiments when a p-type plug 232 is used, the p-plus region 242 and n-plus region 244 may be switched. The cathode 254 may be connected to N-type plus (or n-plus) region 244 by metal 248. The n-plus region 244 is deposited on top of the plug layer 232, which is connected to the NBL 220. In some embodiments, the plug layer 232 is a highly conductive N doped Plug, and the NBL layer 220 is highly conductive. Furthermore, the device may be isolated using one or more deep trenches 234, 236, which may be filled with oxide. In some embodiments, the trenches are located on both sides of the device. In other embodiments, field oxide (FOX) 241, 243, 245 that are filled with oxide may be added to provide lateral isolation. Herein, there may be space between the FOX 241, 243, 245 and n-plus region 242 and p-plus region 244.

This buried layer process allows for the EPI to become a more intrinsic type compound that is better optimized for photodetection when compared to a more standard CMOS process. The buried process allows that the EPI to have a thicker intrinsic region, while the CMOS process allows having a thin region created by the natural diffusion. The thicker EPI enables more efficient detection of longer wavelengths such as 905 nm. With this technology, creating an area for photon detection may be achieved without relying on the creation of a depletion region. The technology may also allow the device to have a topology that is similar to a standard vertical APD as shown in FIG. 1. Furthermore, this silicon EPI process may allow driving the device at 60V or above, which allows managing the increased breakdown voltage coming from a thick vertical device as a result of the EPI process. In some embodiments, the thickness of the EPI layer, created using the technology described herein, may be greater than 8 um, and in an embodiment ranges from about 11-13 um, which is thicker than a corresponding layer in the conventional APD shown in FIG. 1. Another embodiment may have a silicon EPI thickness of 10 to 15 um.

As known in the art, photons with shorter wavelengths are absorbed more rapidly into the material. Accordingly, electron/hole pairs from the shorter-wavelengths photons may be created in a thin layer. Conversely, a photodetector with a thicker layer is needed to detect longer-wavelengths photons. For example, for 905 nm photons in a Light Detection and Ranging (LIDAR), it will take about 30 um for 63% of LIDAR photons to be absorbed. As can be appreciated by those of ordinary skill in the relevant art, the property would differ based on the material type that is used.

The thickness of the EPI layer and the possibility of using other materials instead of EPI may allow detecting photons having a longer wavelength. Furthermore, through the optimization of the inventive concept described herein, it may be possible to absorb photons in an upper layer that does not contribute to the avalanche effect. This ability to absorb photons in an upper layer may allow filtering the visible light "noise" before electron-hole pairs are created in the intrinsic region for the longer-wavelength photons. In some embodiments, a normal layer of n-type silicon may be deposited on top of this intrinsic layer. This structure may allow for better process compatibility with most of the CMOS devices having a thin top EPI layer. This buried EPI layer process may be applied to a photodetector will be described in detail at least in conjunction with FIGS. 3-5.

Figure 3:
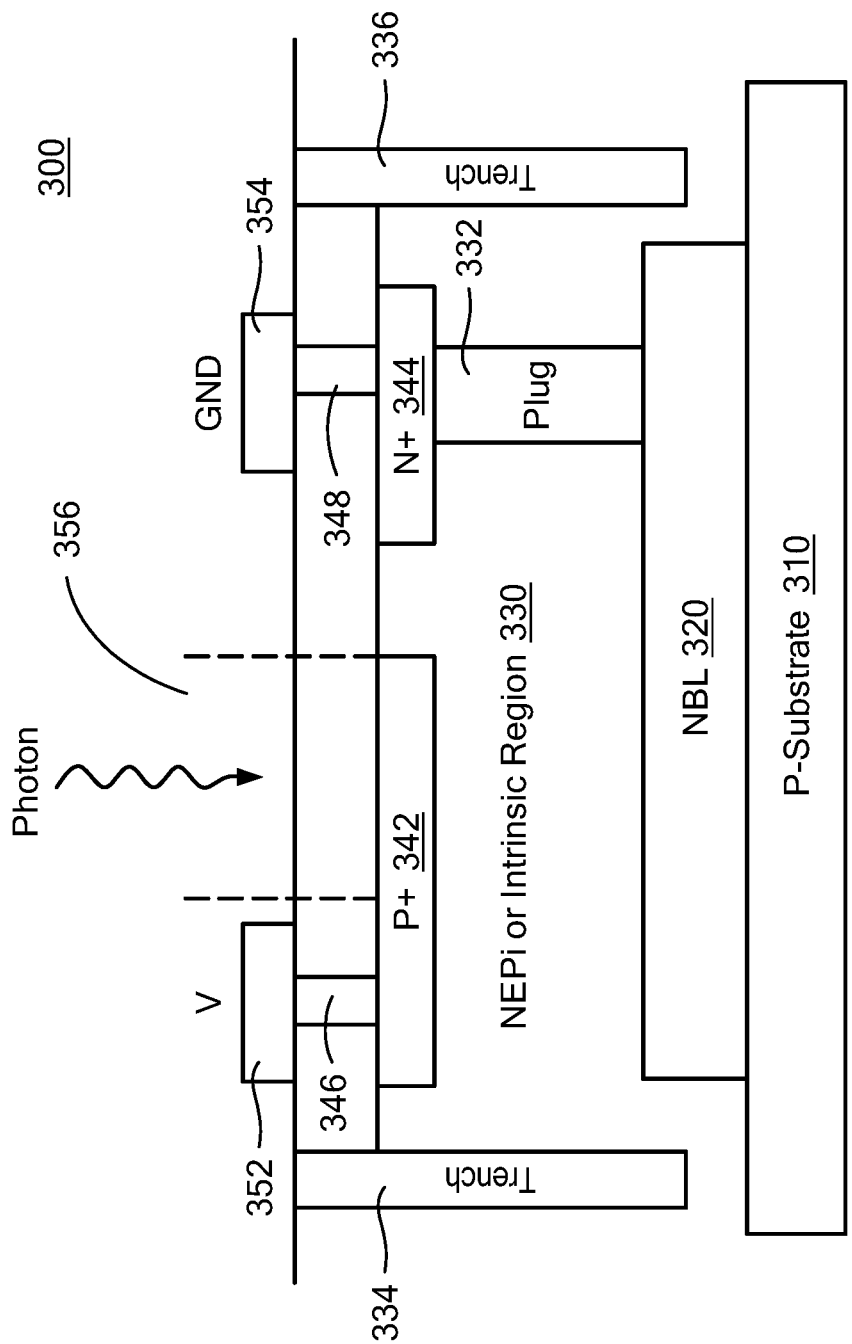
FIG. 3 is a diagram showing an illustrative Photodiode using EPI growth and buried layer process according to the concepts described herein.

Referring now to FIG. 3, a diagram showing a photodetector 300 using EPI growth and buried layer process is presented. The photodetector 300 may include an NBL 320 that is deposited on (or buries) a p-substrate 310. On top of the NBL 320, an N-EPI layer 330 may be grown to bury the NBL 320. In some embodiments, the N-EPI 330 may comprise an intrinsic region comprising the silicon EPI. A plug layer 332 may be implanted and driven to connect the NBL 320 to top layers. A P-type plus (or "p-plus") region 342 and an N-type plus (or "n-plus") region 344 may be deposited on top of the N-EPI layer 330. The n-plus region 344 is coupled to the plug layer 332. A voltage node (or "V-node") 352 and a ground node (or "GND-node") 354 may be deposited on top of the device 300. The V-node 352 and GND-node 354 are coupled, with metal 346, 348, to the p-plus 342 and n-plus 344 respectively. Herein, the combination of NBL 320, EPI layer 330, p-plus 342, and V-node 352 may be considered as a photodetector "cell." A photon-detection area 356 is formed for the cell on a surface of the photodetector. In some embodiments, one or more trenches 334, 336 may be implanted at each side to isolate each cell of the photodetector. In some embodiments, the trenches 334, 336 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material.

The path from GND 354 to NBL 320 through metal 348 and plug 332 provides an efficient way to bias the bottom (NBL and/or P-substrate) of the SPAD 300 without making direct contact to the bottom of the device 300. Another approach to contact the bottom of the device would be to thin the wafer thickness by reducing the substrate thickness. In embodiments, the substrate thickness may be reduced through CMP (chemical mechanical polish) process with the wafer or die before assembly into a package. Using the buried layer approach described herein may achieve the desired characteristics without complex processing required in conventional photodetectors.

In some embodiments, the p-plus region 342 may be optimized in combination with the N-EPI layer 330 to achieve desired characteristics as a photodetector. The region of photosensitivity 356 is the area where the incident photons (i.e., light) can impact the surface. The photons reach the NEPI layer 330 and create electron/hole pairs. The electron/hole pairs then create current up through the p-plus region 342 and down through the NBL 320. The current then goes up to GND 354 through the plug 332, n-plus region 344 and metal 348. Herein, the distance between the p-plus 342 and n-plus 344 may be optimized to avoid any lateral bias in the substrate 310. In embodiments, the distance is farther than the thickness of the N-EPI layer 330. In some embodiments, the EPI layer 330 may be a P-type. The type of the EPI layer is decided from the dopants or majority carriers within the EPI when it is grown. The 'N' or 'P' type will influence how the EPI layer can be used in transistor circuits and how it creates diffusion regions when abutted against another region. For example, N-type semiconductors have excess electron carriers, while p-type have excess hole carriers (positive charge carriers). In other embodiments, the NBL-plug 330, 332 path may be highly doped and comprise a P-type material.

Figure 3A:
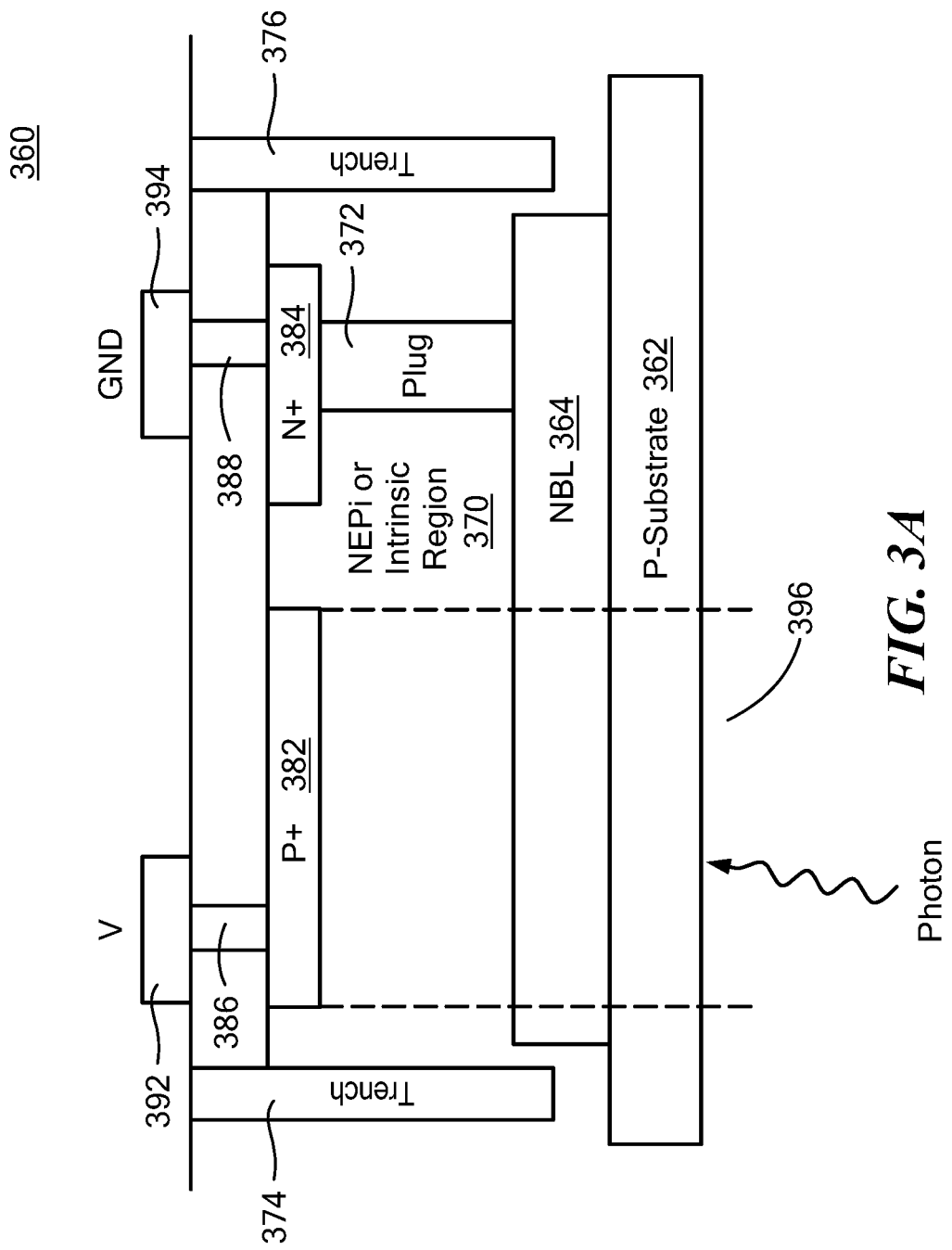
FIG. 3A is a diagram showing an illustrative Photodiode using EPI growth and buried layer process with Backside Illuminated (BSI) approach according to the concepts described herein.

Referring now to FIG. 3A, a diagram showing an illustrative photodetector 360 using Backside-Illuminated (BSI) approach is presented. The photodetector 360 may include an NBL 364 that is deposited on (or buries) a p-substrate 362. On top of the NBL 364, an N-EPI or intrinsic layer 370 may be grown to bury the NBL 364. A plug layer 372 may be implanted and driven to connect the NBL 364 to top layers. A p-plus region 382 and an n-plus region 384 may be deposited on top of the N-EPI layer 370. The nplus region 384 is coupled to the plug layer 372. A V-node 392 and a GND-node 394 may be deposited on top of the device 360. The V-node 392 and GND-node 394 are coupled, with metal 386, 388, to the p-plus 382 and n-plus 384 respectively. In some embodiments, one or more trenches 374, 376 may be implanted at each side to isolate these components. In some embodiments, the trenches 374, 376 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material.

In contrast to a front-illuminated or frontside-illuminated photodetector (e.g., 300 in FIG. 3), a backside-illuminated (BSI) photodetector 360 may receive photons through a photosensitivity region 396 formed at the backside of the photodetector. The back-illuminated photodetector 360 may contain the same elements as the front-illuminated photodetector 300, but the elements may be arranged differently. Accordingly, the photons may strike the EPI layer 370 without passing through the wiring layer, such as the V-node 392 that may reflect some of the incoming photons. Therefore, the BSI photodetector 360 may capture incoming photons with a higher probability than the front-illuminated photodetector. In the present specification, one illustrated BSI photodetector 360 is shown. However, as can be appreciated by those of ordinary skill in the pertinent art, other structures (e.g., 400 in FIGS. 4 and 500 in FIG. 5) also may be changed to support the BSI approach.

Figure 4:
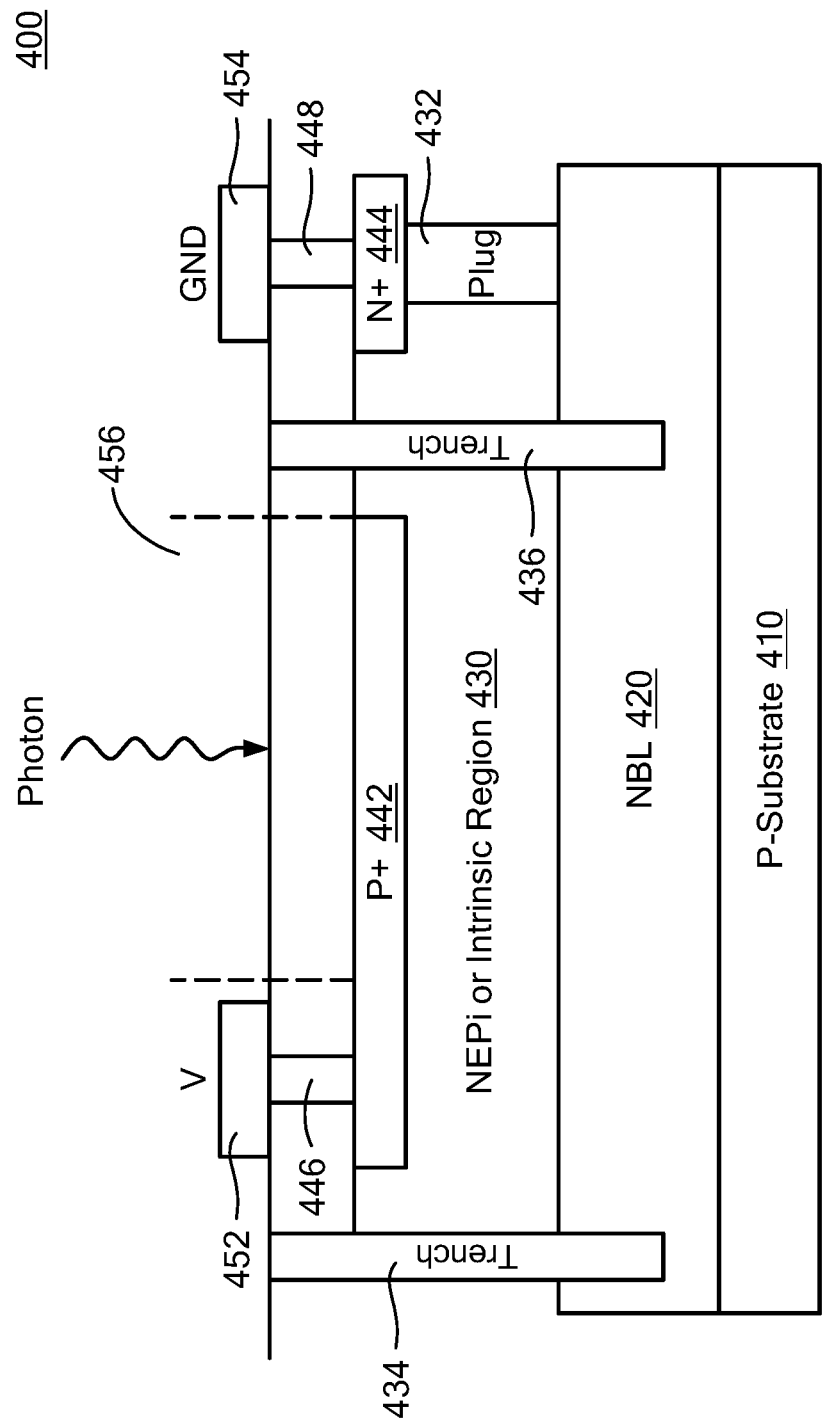
FIG. 4 is a diagram showing another illustrative Photodiode using EPI growth and buried layer process according to the concepts described herein.

Referring now to FIG. 4, a diagram showing another illustrative embodiment of a photodetector 400 is presented. The photodetector 400 may include an NBL 420 that is deposited on (or buries) a p-substrate 410. On top of the NBL 420, an EPI layer 430 may be grown to bury the NBL 420. A plug layer 432 may be implanted and driven to connect the NBL 420 to top layers. A p-plus region 442 and an n-plus region 444 may be deposited on top of the EPI layer 430. The n-plus region 444 is coupled to the plug layer 432. A V-node 452 and a GND-node 454 may be deposited on top of the device 400. The V-node 452 and GND-node 454 are coupled, with metal 446, 448, to the p-plus 442 and n-plus 444 respectively. A photon-detection area 456 is formed on a top surface of the photodetector. Herein, one or more trenches 434, 436 may puncture the NBL 420 and allow the GND return path (NBL 420—plug 442—n-plus 344—GND 454) to be outside of one of the trenches. In some embodiments, the trenches 434, 436 may be filled with an insulator material including but not limited to an oxide or nitride, for example, SiO2, or SiN (SI3N4, or some variant thereof). In other embodiments, the trenches may comprise an organic layer, such as BCB or polyimide, or any other suitable material. This structure may enable that more than one photodetector cell share a common ground return path. Sharing a ground return path by more than one photodetector cell may allow a more densely packed array of photodetector cells and a higher level of photo-sensitive top area.

Figure 5:
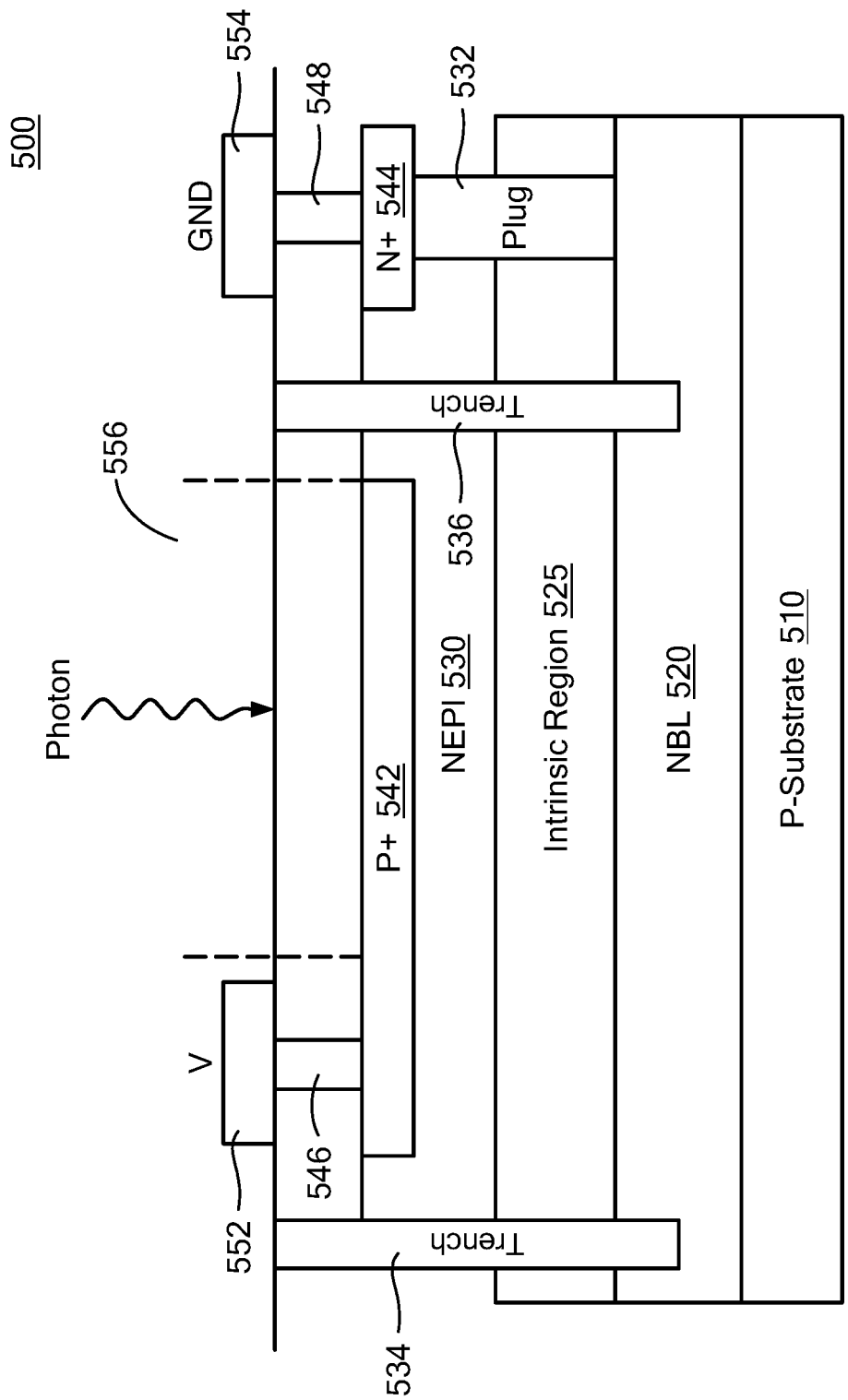
FIG. 5 is a diagram showing an illustrative hybrid Photodiode using buried layer process according to the concepts described herein.

Referring now to FIG. 5, a diagram showing an illustrative embodiment of a hybrid photodetector 500 is presented. The photodetector 500 may include an NBL 520 that is deposited on (or buries) a p-substrate 510. Instead of depositing an EPI layer on top of the NBL 520 directly, an intrinsic layer 525 may be deposited. This structure may be used when the chosen intrinsic material cannot be used for standard CMOS silicon. On top of the intrinsic layer 525, an EPI layer 530 may be deposited. A plug layer 532 may be implanted and driven to connect the NBL 520 to top layers, crossing the intrinsic layer 525. A p-plus region 542 and an n-plus region 544 may be deposited on top of the EPI layer 530. The n-plus region 544 is coupled to the plug layer 532. A V-node 552 and a GND-node 554 may be deposited on top of the device 500. The V-node 552 and GND-node 554 are coupled, with metal 546, 548, to the p-plus 542 and n-plus 544 respectively. A photon-detection area 556 is formed on a top surface of the SPAD 500. In some embodiments, one or more trenches 534, 536 may puncture the NBL 520 to isolate a SPAD cell.

This structure of having an N-EPI layer 530 on top of additional intrinsic layer 525 may allow a normal device to be implanted into the N-EPI and enable that a more exotic material can be used for the intrinsic region to detect the incident photons. The more exotic materials may have a lower "energy-gap or band-gap," which allows for the creation of an electron/hole pair with a lower energy level. Higher wavelength photons have a lower energy level, which makes it impossible to form an electron/hole pairs without a material that has a lower "band-gap." Accordingly, being able to use more exotic materials could be effective for detecting longer-wavelength photons.

Figure 6:
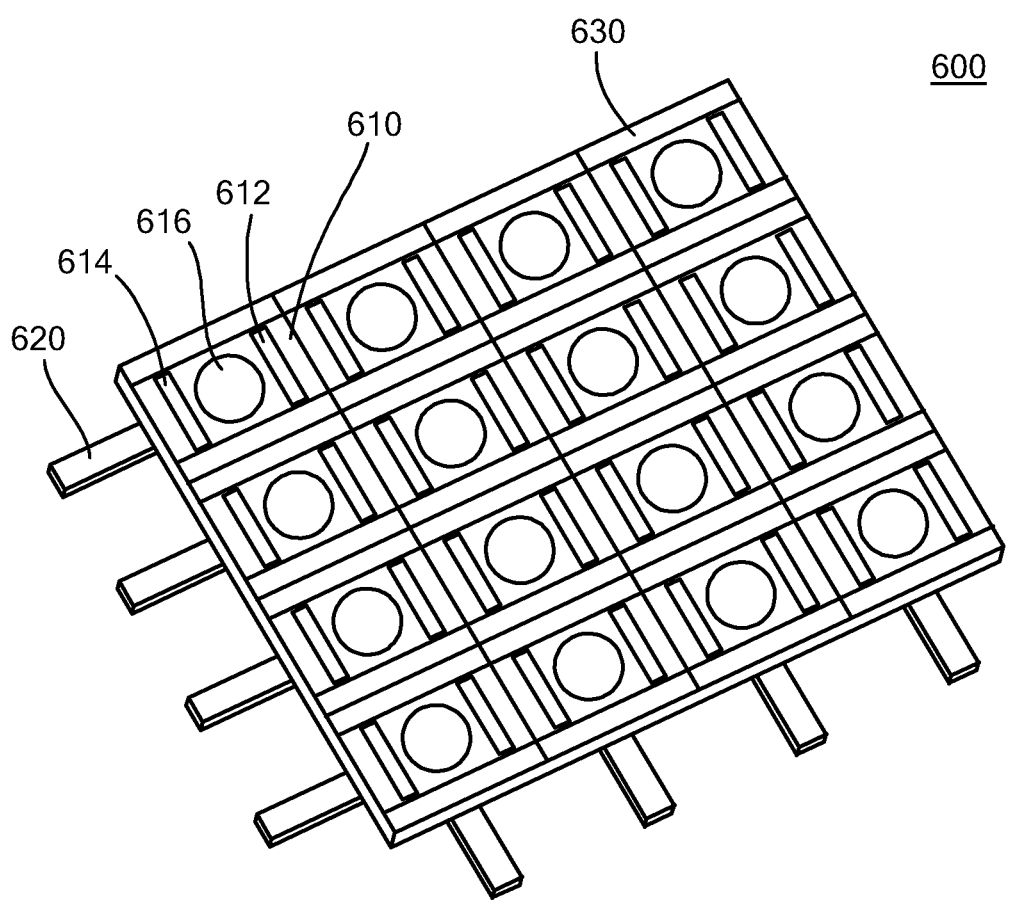
FIG. 6 is a diagram showing an illustrative multi-cell array of Photodiodes according to the concepts described herein.

Referring now to FIG. 6, more than one photodetector may be combined to create a multi-cell photodetector array 600. The photodetector cell may comprise an area for photon-sensing and other related materials/parts to process received photon and generate corresponding signals. In an illustrative embodiment, each of the cells 610 of the photon-detector array comprises a photodetector. Each photodetector 610 may have a photon-detection area 616 and a plurality of nodes 612, 614. The plurality of nodes 612, 614 in each cell may be connected using inter-cell connectors 630. The photon-detectors array may be connected to other components using a plurality of nodes 620 for the array 600. By combining multiple-cells in a single assembly, the overall PDE of the assembly may be increased, but not necessarily for individual cells of the assembly.

By using the concepts described herein, the photodetector created using the EPI growth and buried layer process may enable both dense integration of cells and a much thicker vertical region to improve Photon Detection Efficiency (PDE). A photodetector created using the concepts described herein may enable detecting a photon that has a long wavelength in a multi-cell array. The buried layer process enable a better connection from the top layer to the bottom layer with a low resistance path without having to thin the wafer. Furthermore, with a combination of the buried layer and trench, a plurality of individual cells may be created by varying the trench depth.

In an illustrative embodiment, a photodetector with an n-type EPI layer having a thickness of 11 um to 13 um, which is thicker than the ones from conventional technologies may provide a PDE of about 50%. In contrast, a conventional Silicon photomultiplier (SiPM) has a PDE of about 7% for 905 nm. This alternative option provides manufacturing flexibility and different characteristics for the photodetector. In addition, it is also possible to place a layer of standard EPI on top of the intrinsic layer.

One or more trenches comprising various materials may block cross triggering of adjacent photodetector cells. The depth of the trenches may be adjusted to create different cell arrangements, such as separating grounds or having common grounds across certain cell groups. Furthermore, patterned backside metal may be used to connect individual cells on the back-side, rather than connecting them all in common. By isolating photon-detection cells through the full thickness of the device, it is possible to connect using backside connections.

Figure 7:
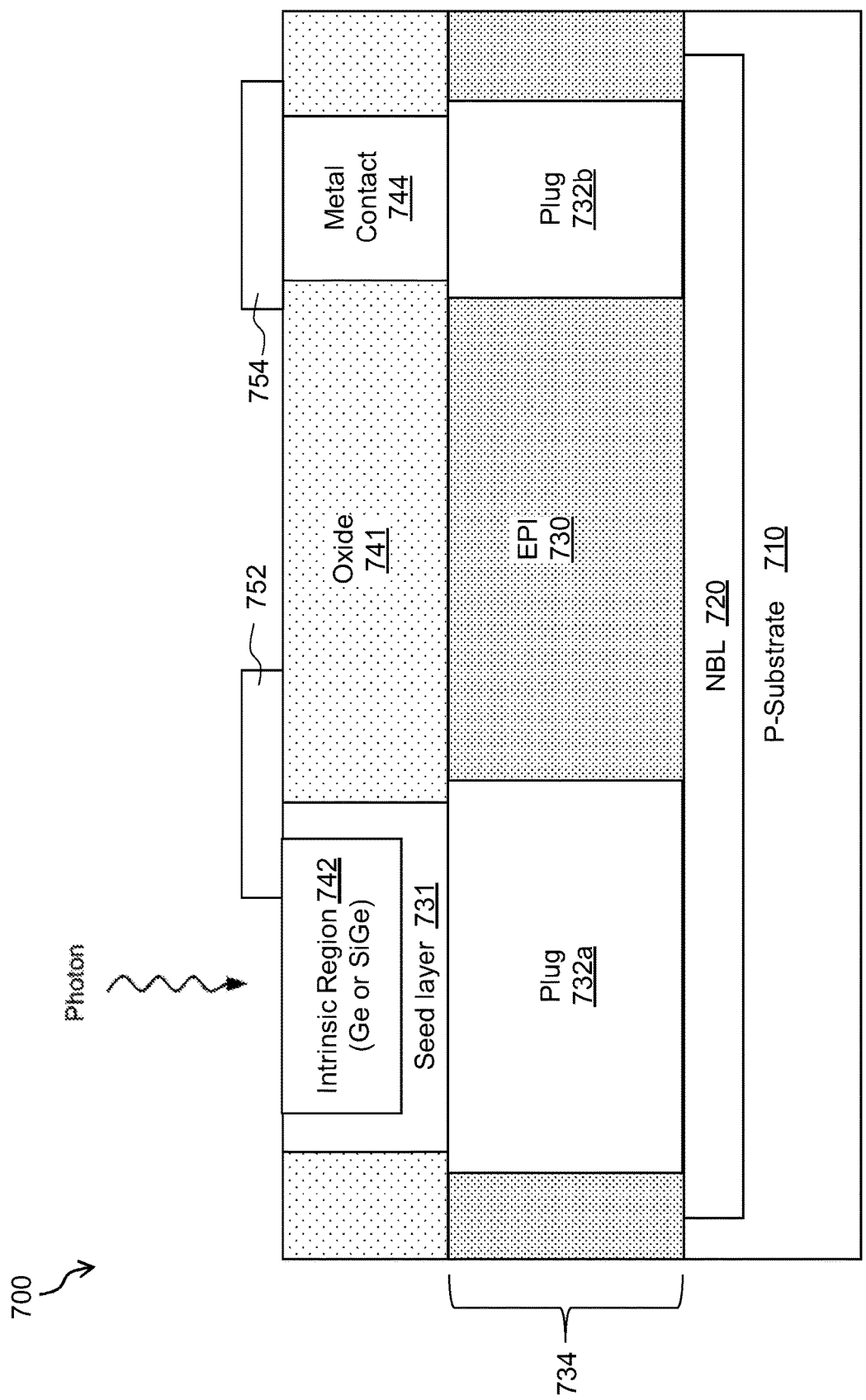
FIG. 7 is a side view of an illustrative photodetector device for short-wave applications, according to an embodiment of the present disclosure.

FIG. 7 shows an illustrative photodetector device 700 that can be used for short-wave applications, 900 nm to 1,700 nm, such as applications requiring detection of photons having a wavelength of 1550 nm or of about 1550 nm. The process may also be used for other wavelengths with different sensitive materials. As one example, device 700 can be used for detection of photons at SWIR (Short-Wave Infra-Red) wavelengths up to 1800 nm. Similar to the devices described above in the context of FIGS. 2-5, the device 700 can be formed using a process compatible with integrated circuits including, but not limited to CMOS devices, and BCD devices.

The illustrative device 700 can include a substrate 710 (e.g., a P-type silicon substrate, or p-substrate), a bottom contacting layer (or "interconnect layer") 734 disposed over a top surface of the substrate, an insulating layer 741 (e.g., an oxide layer) disposed over a top surface of the bottom contacting layer 734, an intrinsic region 742, a metal contact 744, an anode 752 disposed over a top surface of the intrinsic region 742, and a cathode 754 disposed over a top surface of the metal contact 744. Intrinsic region 742 can include a photo-responsive material capable of detecting short wavelength photons (e.g., photons having a wavelength of 900 nm to 1,700 nm including in some cases about 1550 nm). The photo-responsive material can be a low band-gap material, such as Germanium (Ge), Silicon-Germanium (SiGe), or Indium Gallium Arsinide (InGaAs). The particular photo-responsive material used in device 700 can be selected based on a desired photonic response. In some embodiments, metal contact 744 may include Aluminum (Al) or Tungsten (W). In an embodiment the metal contact 744 may be replaced by another conductor such as a doped polysilicon with sufficient conductivity to pass electrical current. In some embodiments, anode 752 and cathode 754 may include a metal, such as Aluminum (Al), Tungsten (W), or Indium Tin Oxide (ITO).

Figure 10:
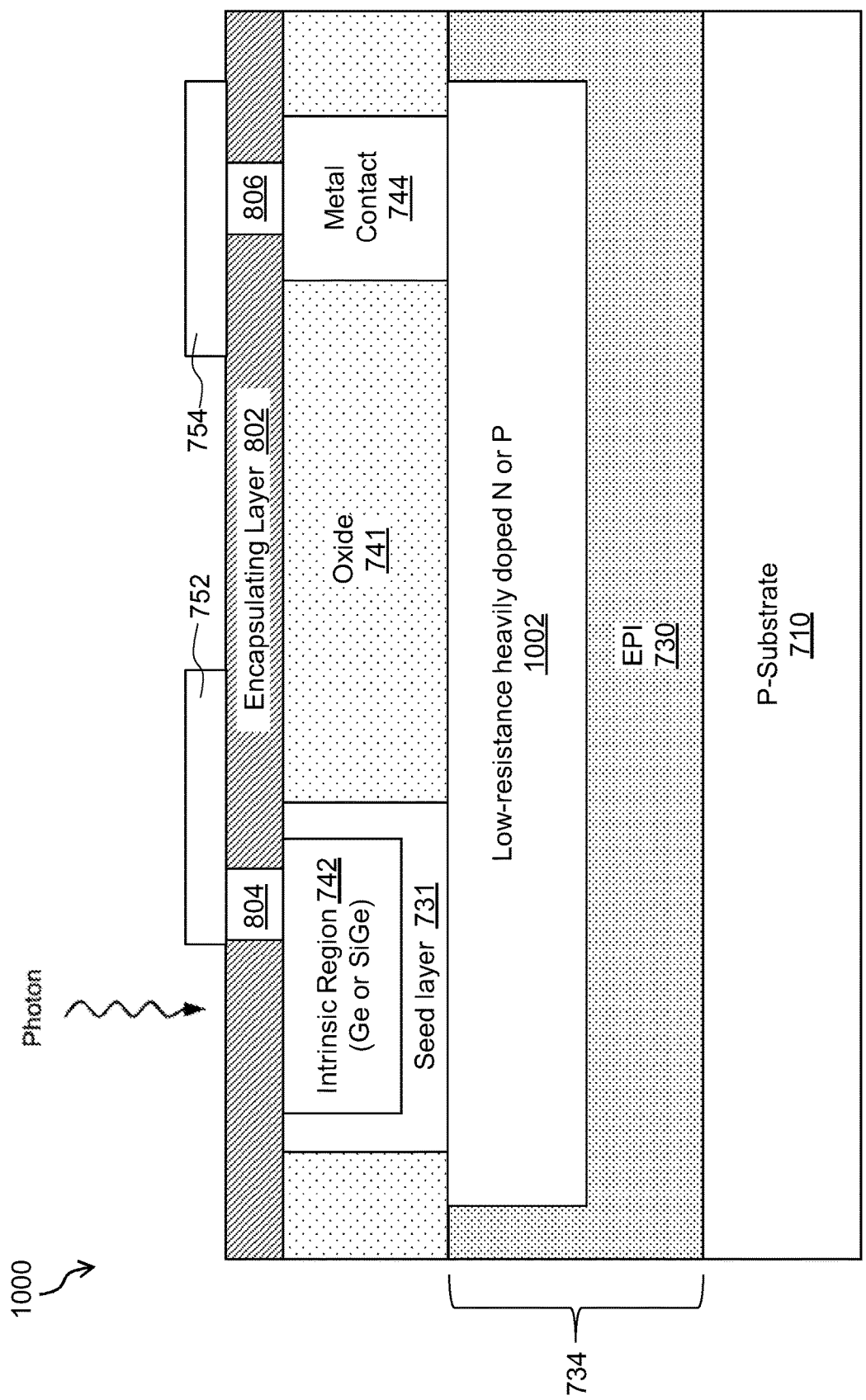
Figure 11:
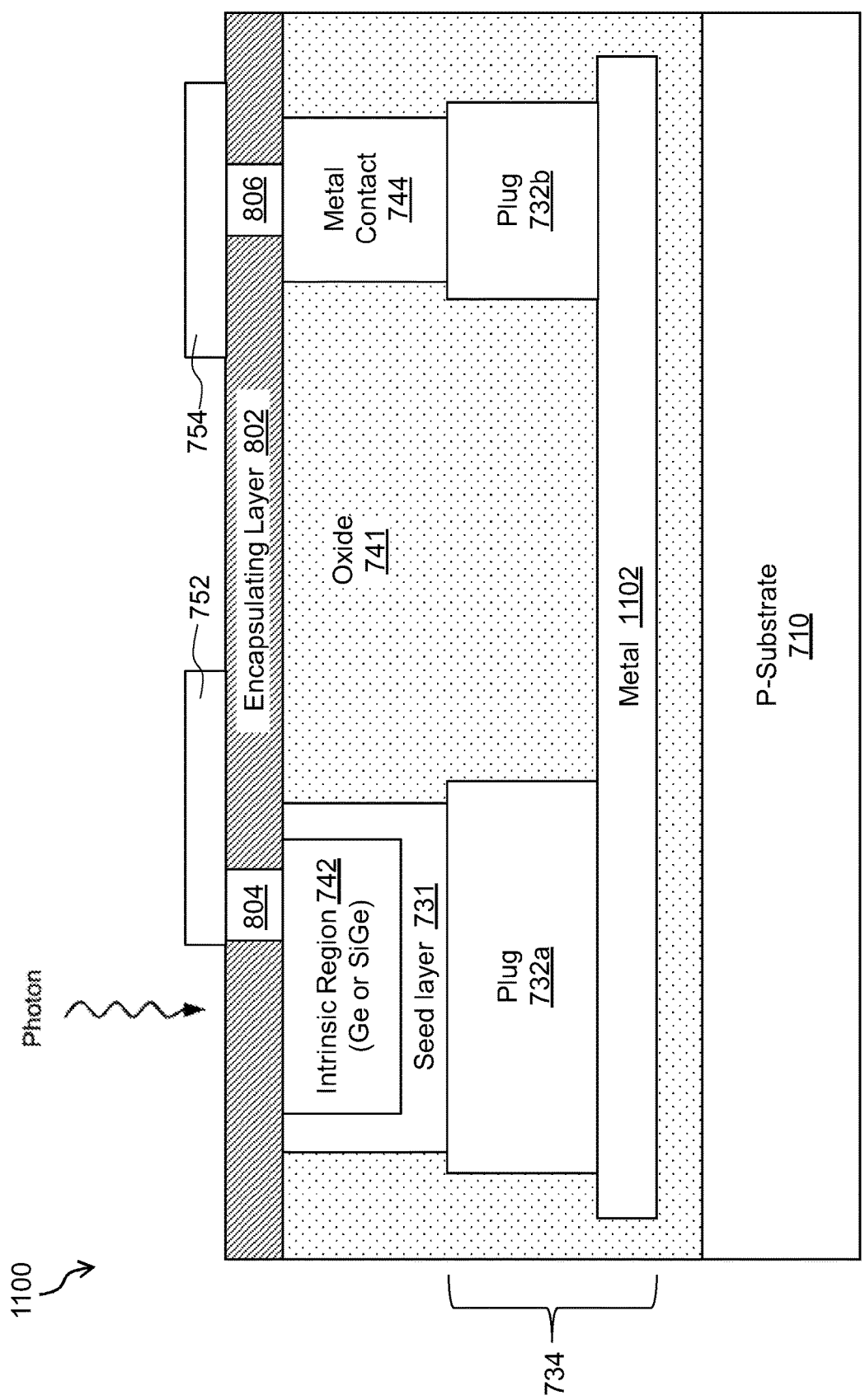

Bottom contacting layer 734 may provide a low resistance path between the intrinsic region 742 and the metal contact 744. In this arrangement, current can flow into the device 700 through anode 752, down through intrinsic region 742 (i.e., through the photo-responsive material) to bottom contacting layer 734, up from bottom contacting layer 734 to metal contact 744, and out from the device through cathode 754. In more detail, bottom contacting layer 734 can provide two separate contacting regions to make electrical contact with upper layers of the device 700, and provide a low-resistance path between the two contacting regions. Various embodiments of the bottom contacting layer 734 are possible. FIG. 7 shows one example of a bottom contacting layer 734 based on buried layer process (e.g., similar to the buried layer processes discussed above in the context of FIGS. 1-4). FIGS. 10 and 11 show alternate embodiments of a bottom contacting layer 734.

Referring to the embodiment of FIG. 7, an N-type buried layer (NBL) 720 may be implanted into substrate 710 using, for example, a masked implanting process. In another embodiment the implanted region may not be masked, which may provide cost saving if a single photodetector is being fabricated per die after a process including but not limited to dicing. Bottom contacting layer 734 can include an EPI layer 730 disposed over the substrate 710, a first plug 732a implanted or fabricated into the EPI layer 730 to provide a low resistance path between the intrinsic region 742 and the NBL 720, and a second plug 732b implanted or fabricated into the EPI layer 730 to provide electrical contact between the metal contact 744 and the NBL 720. In another embodiment the plug 732a may be wider and no epi would be needed so that metal contact 744 connects directly to a portion of plug 732a but is not connected to the seed layer 731 or intrinsic region 742. Thus, first and second plugs 732a, 732b may correspond to first and second contacting regions providing electrical contact to upper layers of the device 700. In some embodiments, EPI layer 730 may be an undoped layer. In some embodiments, plugs 732a, 732b may include a heavily doped N-type material. The undoped EPI layer 730 may have a high resistance relative to plugs 732a, 732b and NBL. In this arrangement, a low resistance path may be provided between first and second plugs 732a, 732b through NBL 720.

An illustrative process for forming device 700 is described next in the context of FIGS. 7A-7E, in which like elements of FIG. 7 are shown using like reference designators.

Figure 7A:
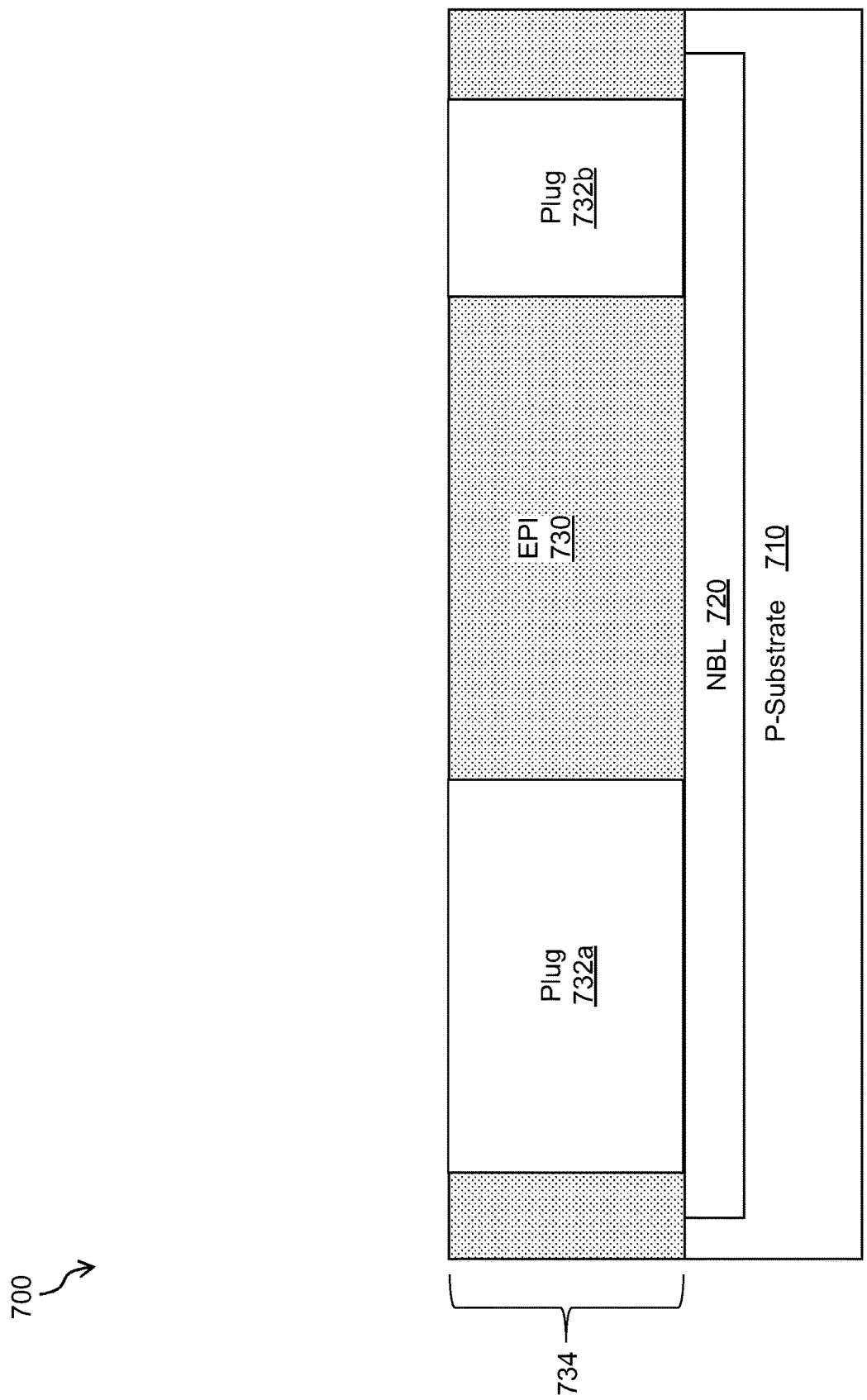
FIGS. 7A-7E are side views showing intermediate steps in forming the photodetector device of FIG. 7, according to the concepts described herein.

Referring to FIG. 7A, device 700 may comprise a substrate 710, such as a P-type silicon substrate (or p-substrate). An N-type buried layer (NBL) 720 can be implanted on a top surface of the substrate 710. An undoped or lightly doped, such that a majority of the current would flow through the NBL 720, EPI layer 730 may be grown over the substrate 710 and NBL 720. Plugs 732a, 732b can then be implanted or fabricated into the EPI layer 730.

Figure 7B:
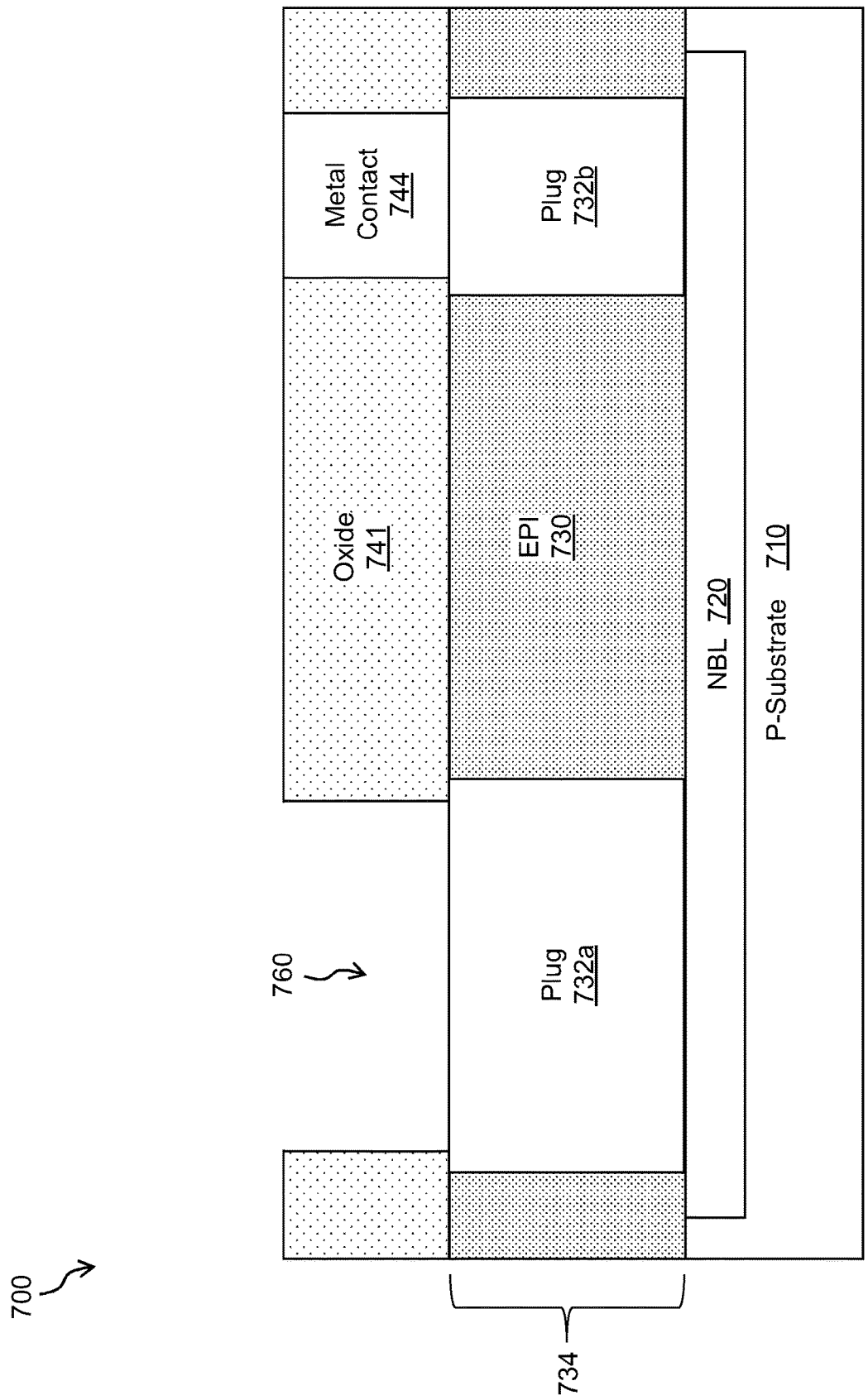

Referring to FIG. 7B, an oxide layer 741, or other insulating layer, can be deposited over a top surface of bottom contact layer 734. A cavity 760 can be etched into the insulating layer 741, stopping at the top surface of bottom contacting layer 734. Metal contact 744 (i.e., a low resistance path) can be formed by etching an area of the insulating layer 741 and then filling the etched area with the contact material (which may be polished back or filled as part of higher level interconnect, such as cathode 754).

Figure 7C:
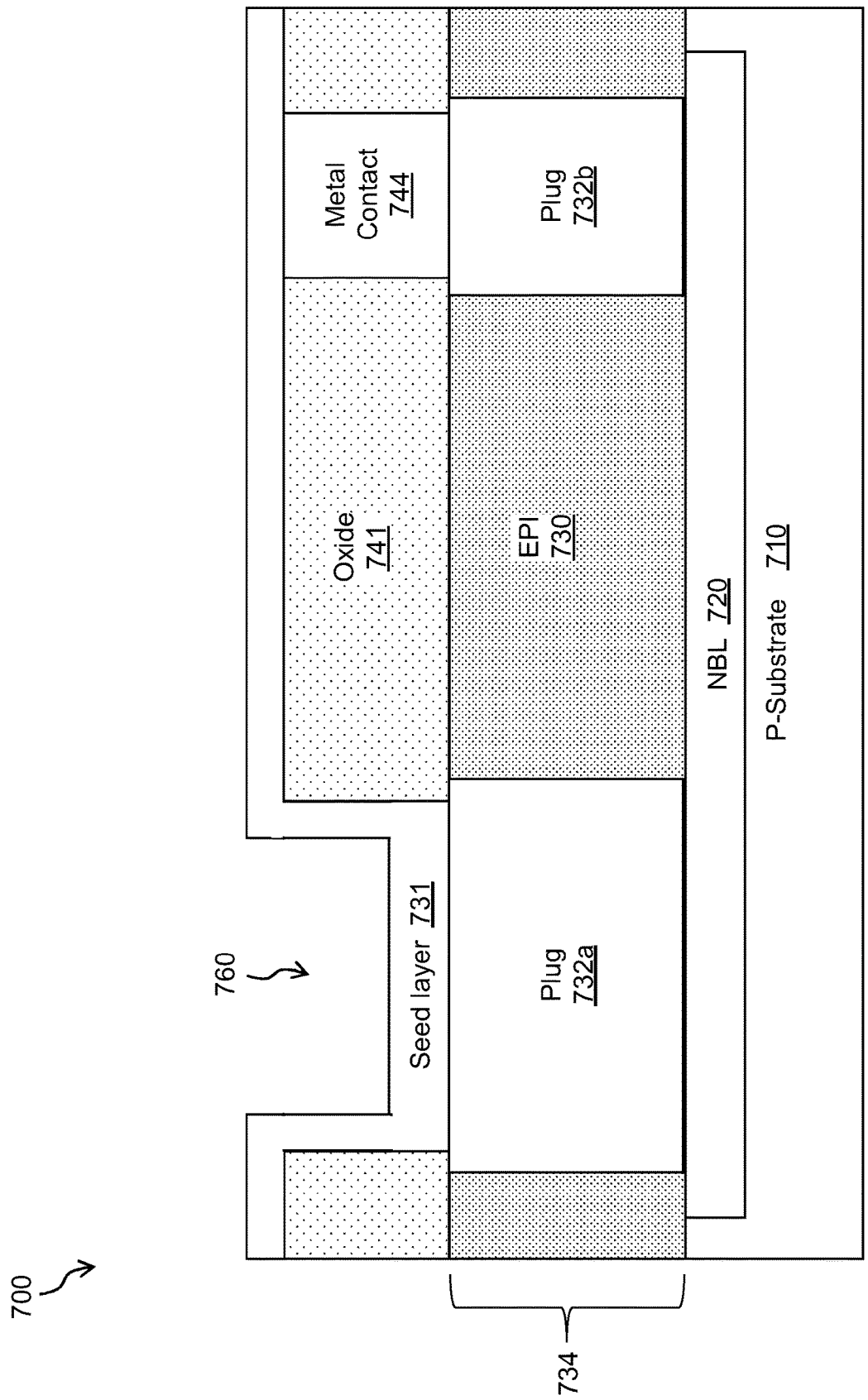

Referring to FIG. 7C, after forming cavity 760, a seed layer 731 can be deposited over one or more surfaces of the device 700. In an embodiment the seed layer may not be used. For example, as shown in FIG. 7C, seed layer 731 can be deposited over the etched cavity 760, the insulating layer 741, and the metal contact 744. Seed layer 731 can be formed of a low resistance doped epitaxial silicon. In some embodiments, the material used within seed layer 731 may be selected so as to have a compatible crystalline structure with the photo-responsive material used in the intrinsic region 742 (FIG. 7). For example, seed layer 731 can have a crystalline structure compatible with Ge, SiGe, or InGaAs. In some embodiments, seed layer 731 can be omitted.

Figure 7D:
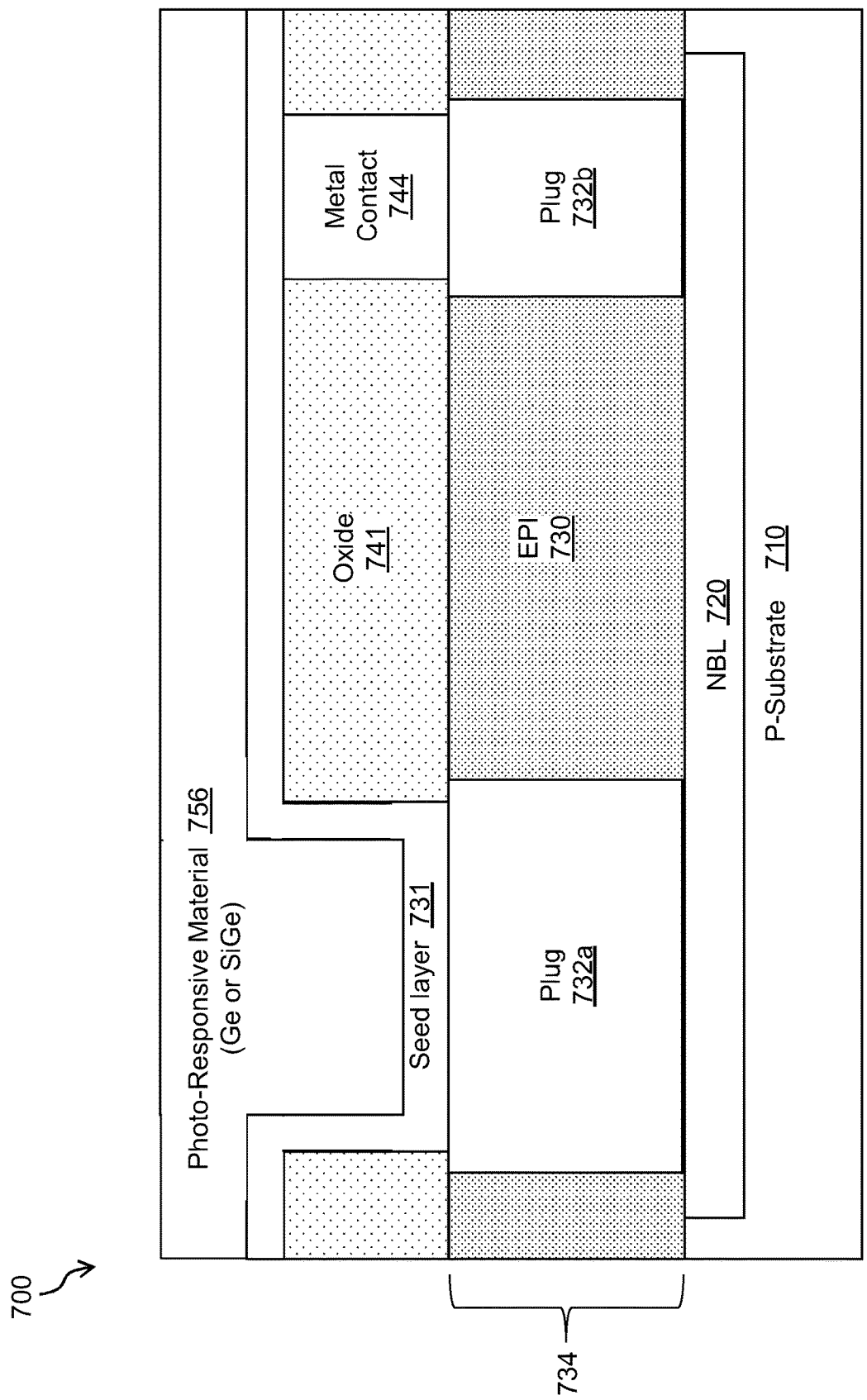

Referring to FIG. 7D, photo-responsive material 756 (e.g., Ge, SiGe, or InGaAs) can be deposited over the seed layer 731. While FIG. 7D shows the seed layer 731 and photo-responsive material 756 disposed over the entire top surface insulating layer 741, in other embodiments the seed layer and/or photo responsive material 756 may be isolated to the intrinsic region etched cavity 760 (FIG. 7C). In embodiments where seed layer 731 is omitted, photo-responsive material 756 may be deposited directly over the insulating layer 741. Although shown as extending above 741, the photo-responsive material 756 may not extend above the level of the oxide or insulator 741 in an alternative embodiment.

Figure 7E:
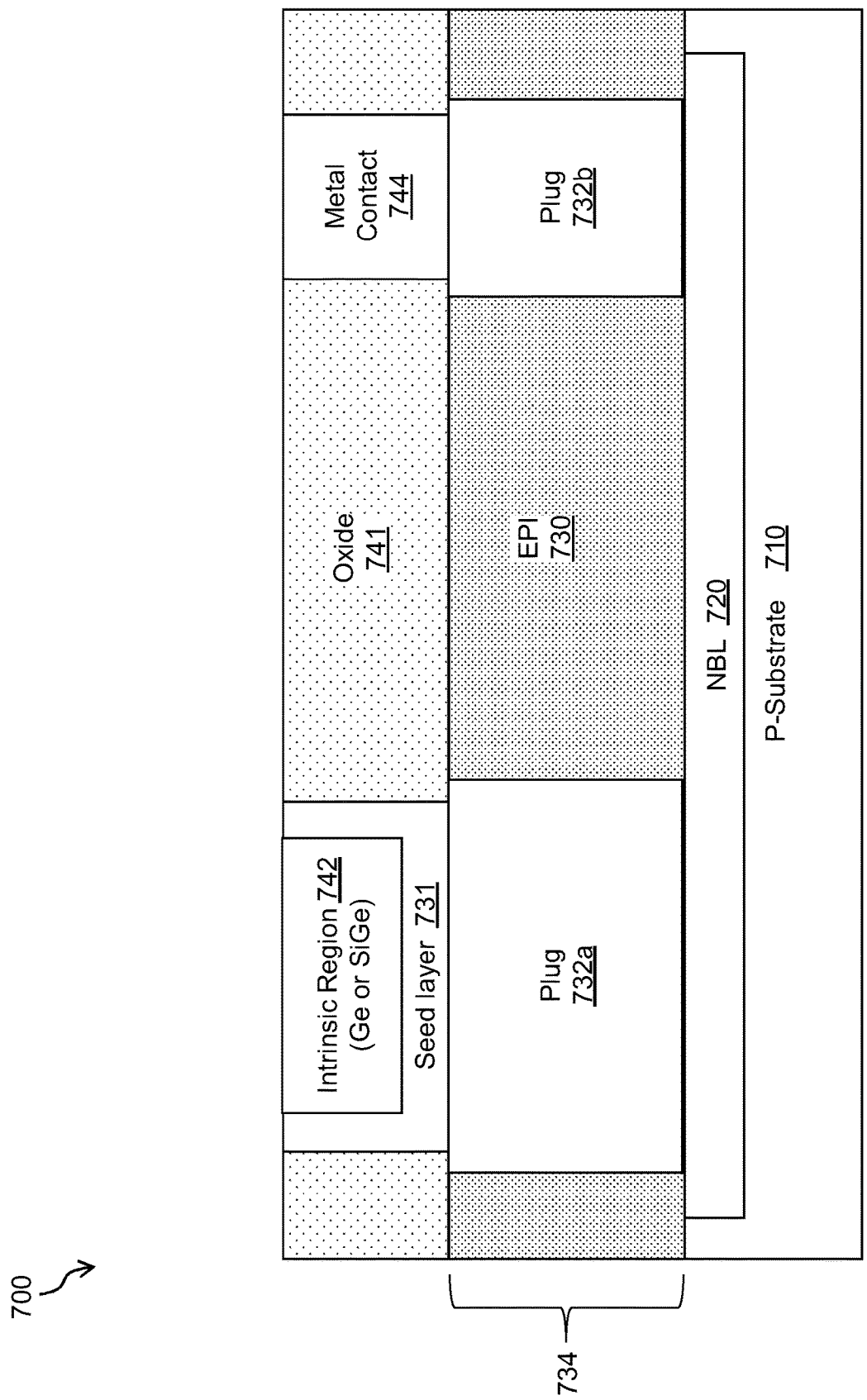

Referring to FIG. 7E, after deposition of the photo-responsive material 756, the top surface of device 700 may be polished or etched back to provide a flush planar top surface. That is, the excess photo-responsive material (e.g., Ge, SiGe, or InGaAs) may be removed to leave a flush planar top surface and an exposed intrinsic region 742. In an alternative construction the photo-responsive material 756 may be deposited and then etched back without a polishing step.

In some embodiments, deposition of the insulating layer 741 (FIG. 7B), seed layer 731 (FIG. 7C), and/or photo-responsive material 742 (FIG. 7D) can be performed using an EPI or other CVD (chemical vapor deposition) process. In some embodiments, deposition of these layers can be done using sputtering or another PVD (physical vapor deposition) process, or atomic layer deposition (ALD). In some embodiments, ALD processing may be used for the seed layer 731.

Referring back to FIG. 7, anode 752 can be formed on the top surface of the device 700 at a location to be in electrical contact with intrinsic region 742. Cathode 754 can be formed on the top surface of the device 700 at a location to be in electrical contact with meta contact 744. In some embodiments, anode 752 and cathode 754 can be etched or deposited on the top surface of the device 700, and then patterned with a "lift off" process. As shown in FIG. 7, anode 752 may partially cover the top surface of intrinsic region 742. That is, anode 752 may be offset from intrinsic region 742 such that at least a portion of intrinsic region 742 is not covered by anode 752. In this arrangement, device 700 may be used as a frontside-illuminated photodetector by allowing photons to reach intrinsic region from the top of device 700. In the case of the one or both the anode 752 Indium Tin Oxide (ITO) sufficient light may pass through the anode 752 to allow the anode to cover a larger portion of the intrinsic region 742.

In some embodiments, the intrinsic region 742 may be provided as a distinct layer, i.e., not formed within insulating layer 741. In this case, photo-responsive material (e.g., Ge, SiGe, or InGaAs) may be deposited over EPI layer 730, either directly or via a seed layer deposited over the EPI layer 730. Metal contacts may then be etched into the photo-responsive layer to provide electrical contact between anode 752 and first plug 732a, and between cathode 754 and second plug 732b. Using this approach, insulating layer 741 can be omitted or otherwise provided as a distinct layer from the photo-responsive layer.

Figure 8:
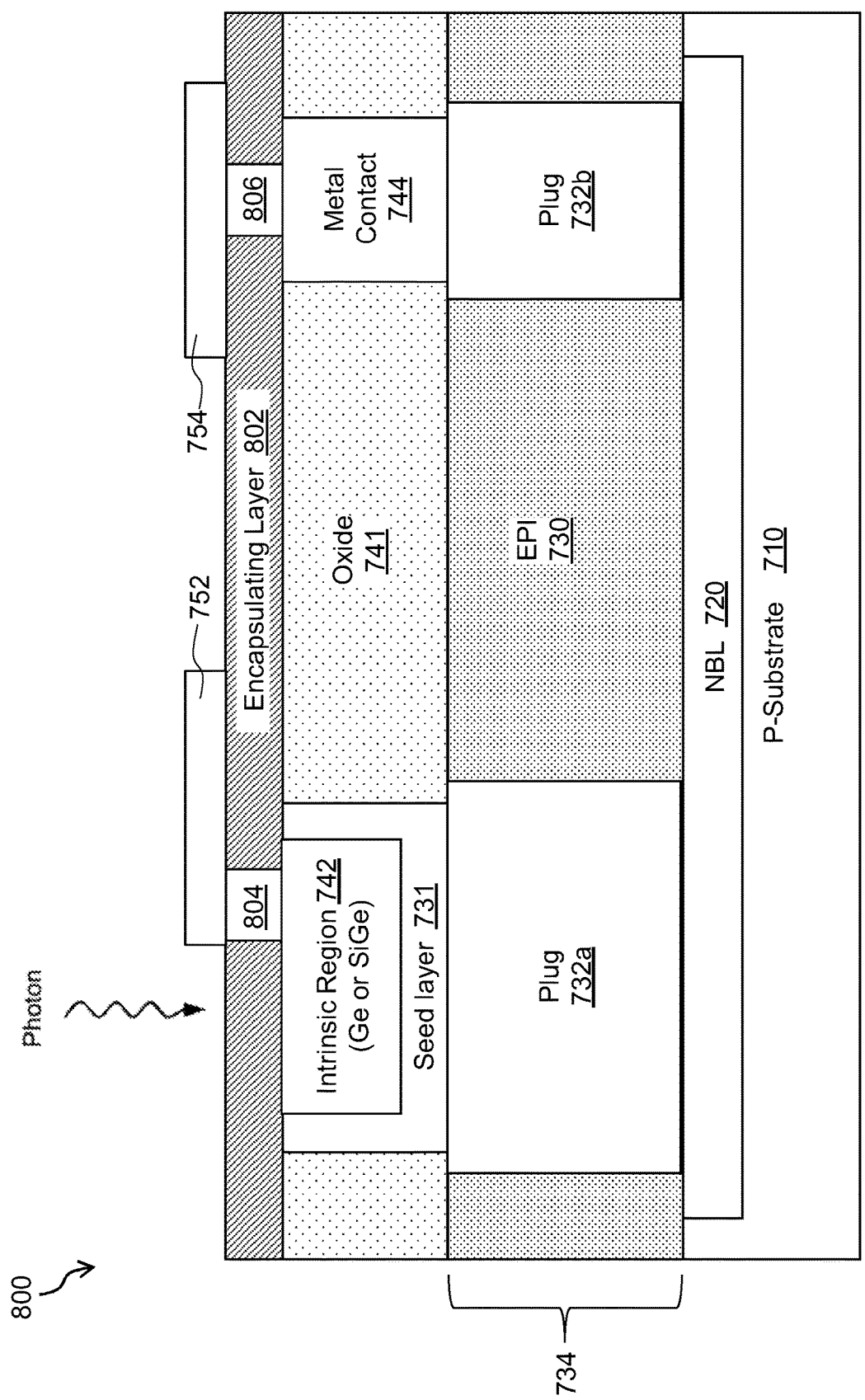
FIG. 8 is a side view showing an illustrative photodetector device for short-wave applications, according to another embodiment of the present disclosure.

Referring to FIG. 8, in which like elements of FIG. 7 are shown using like reference designators, in some embodiments, a photodetector device 800 may include an encapsulating layer 802 (e.g., an encapsulating oxide layer or other layer which has sufficient transparency for the wavelength of interest) disposed over the top surface of the device. More particularly, encapsulating layer 802 may cover the intrinsic region 742 and/or the insulating layer 741. A first encapsulating plug 804 may be formed in encapsulating layer 802 to provide electrical contact between anode 752 and intrinsic region 742. A second encapsulating plug 806 may be formed in encapsulating layer 802 to provide electrical contact between cathode 754 and metal contact 744. In some embodiment, encapsulating plugs 804, 806 can be formed using etching (e.g., etching the oxide other material for layer 802), deposition and polish, deposition followed by etching, or etching and then deposition where the plugs and connecting metal are the same material. In some embodiments, encapsulating plugs 804, 806 can include but is not limited to Tungsten (W), or Aluminum, or Indium Tin Oxide (ITO). An encapsulating layer, such as show in FIG. 8, can be combined with other embodiments described herein. For example, in embodiments where a distinct photo-responsive layer is provided, encapsulating layer 802 may be disposed over the photo-responsive layer instead of over insulating layer 731.

Figure 9:
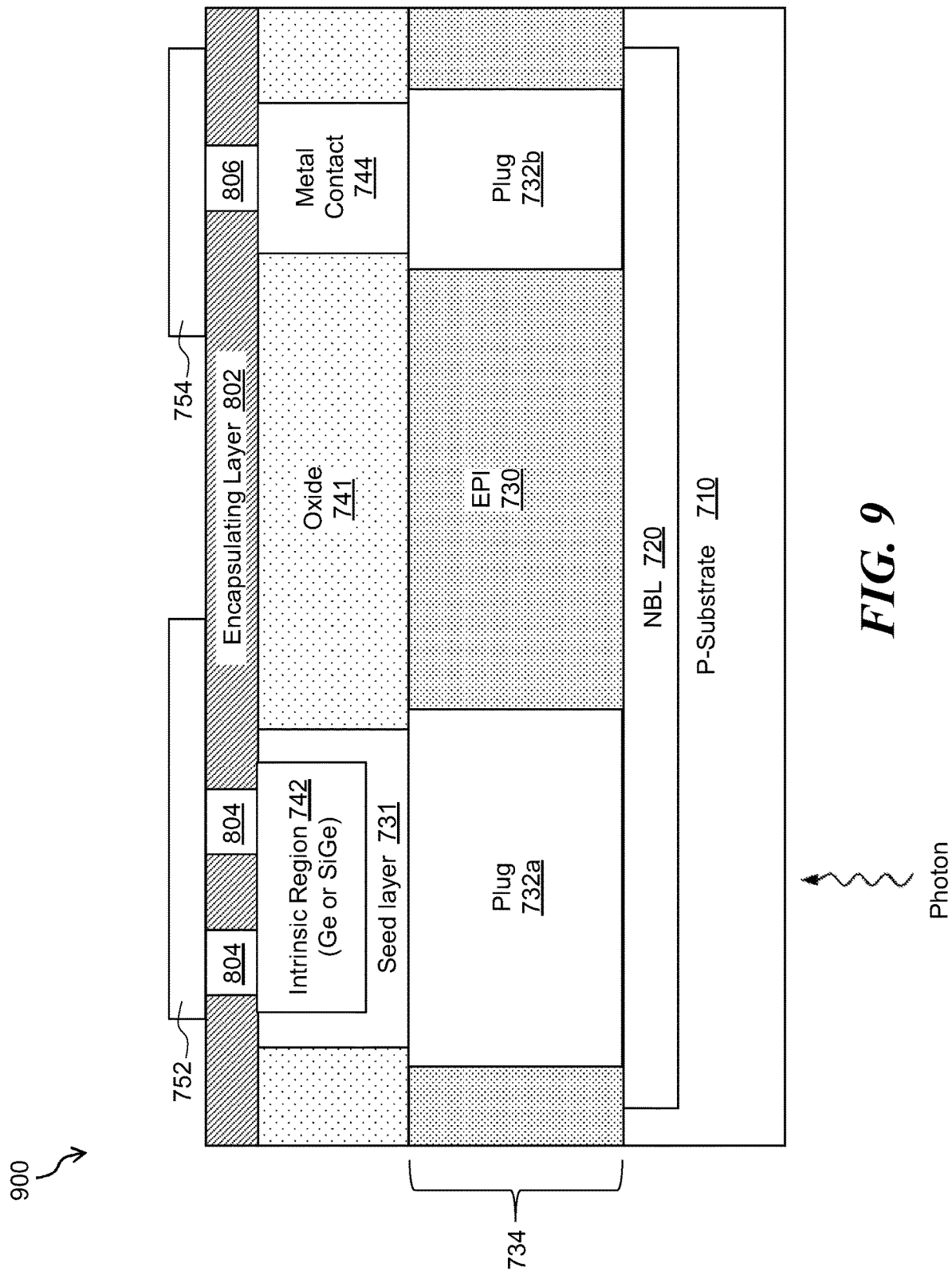
FIGS. 9, 10, and 11 are side views showing additional embodiments of photodetector devices for short-wave applications.

FIG. 9, in which like elements of FIGS. 7 and 8 are shown using like reference designators, shows another embodiment of a short-wave photodetector device 900. In the embodiment of FIG. 9, anode 752 may cover the entire (or substantially the entire) top surface of intrinsic region 742. In this arrangement, anode 752 may block intrinsic region 742 from photon exposure and, thus, device 900 may be suitable for use as a backside-illuminated photodetector (i.e., to detect photons from below the device). In some embodiments, multiple plugs 804 may be implanted in the encapsulating layer 802 to provide electrical contact between the anode 752 and the intrinsic region 742. These additional plugs 804 may further contribute to photo blocking from the top of the device 900. In some embodiments, encapsulating layer 802 and plugs 804, 806 may be omitted. That is, anode 752 may be disposed directly over intrinsic region 742, and cathode 754 may be directly disposed over metal contact 744.

FIG. 10, in which like elements of FIGS. 7, 8, and 9 are shown using like reference designators, shows another embodiment of a short-wave photodetector device 1000. In this embodiment, bottom connecting layer 734 can include a low-resistance heavily doped N or P layer 1002. That is, the NBL 720 and plugs 732a, 732b of FIG. 7, 8, or 9 can be replaced with low-resistance layer 1002. In some embodiments, low-resistance layer 1002 can be formed using a patterned implant process. In other words, low-resistance layer 1002 may provide the first and second contacting regions of the bottom contacting layer 734. Device 1000 may be suitable for use as either a frontside- or backside-illuminated photodetector. In some embodiments the substrate 710 may thinned after the fabrication is complete to allow the photo-responsive device to be thinner. This may be of interest where multiple wavelengths are to be detected and the photodetectors are stacked.

FIG. 11, in which like elements of FIGS. 7, 8, and 9 are shown using like reference designators, shows another embodiment of a short-wave photodetector device 1100. In this embodiment, bottom connecting layer 734 can include a metal layer 1102 to provide a low resistance path between the first plug 732a and the second plug 732b. In such an embodiment the plugs 732a, 732b may be metal. That is, the NBL 720 of FIG. 7, 8, or 9 can be replaced with metal layer 1102. Metal layer 1102 and plugs 732a, 732b may be etched into the insulating layer 741 (e.g., using oxide etching). It should be noted that, in the embodiment of FIG. 11, the EPI layer can be omitted. Device 1100 may be suitable for use as a frontside-illuminated photodetector.

The photodetector devices show in FIGS. 7-11 and described above in the context therefore can be used for short-wave applications, such as detecting photons having a wavelength of 1550 nm or of about 1550 nm. The illustrated devices allow for integration with active silicon while using a photo-responsive material such as Ge, SiGe, or InGaAs. Moreover, the illustrated devices can provide isolation between elements by not having direct contact between adjacent elements. Further, the devices can reduce noise by providing low resistance paths between terminals.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:
1. A photodetector device comprising:
    a substrate layer;
    an n-type buried layer (NBL) implanted into the substrate layer;
    a bottom contacting layer disposed over a surface of the substrate layer and having a first contacting region and a second contacting region, the bottom contacting layer providing a low resistance path between the first and second contacting regions, the bottom contacting layer having:
        an epitaxial (EPI) layer disposed over the surface of the substrate layer and a surface of the NBL,
        a first plug implanted into the EPI layer, the first plug in electrical contact with the NBL, the first plug corresponding to the first contacting region, and
        a second plug implanted into the EPI layer, the second plug in electrical contact with the NBL, the second plug corresponding to the second contacting region;
    an insulating layer disposed over a surface of the bottom contacting layer;
    an intrinsic region disposed within the insulating layer, the intrinsic region in electrical contact with the first contacting region of the bottom contacting layer, the intrinsic region comprising a low band-gap material;

a metal contact disposed within the insulating layer and in electrical contact with the second contacting region of the bottom contacting layer;
an anode in electrical contact with the intrinsic region; and
a cathode in electrical contact with the metal contact.

2. The device of claim 1, wherein the low band-gap material comprises Germanium (Ge), Silicon-Germanium (SiGe), or Indium Gallium Arsinide (InGaAs).

3. The device of claim 1, wherein the insulating layer comprises an oxide.

4. The device of claim 1, wherein the intrinsic region is formed within an etched cavity of the insulating layer, the device comprising a seed layer disposed over one or more surfaces of the etched cavity.

5. The device of claim 4, wherein the seed layer has a crystalline structure compatible with the low band-gap material.

6. The device of claim 1, comprising:
an encapsulating layer disposed over a surface of the insulating layer;
a first plug disposed within the encapsulating layer and providing electrical contact between the anode and the intrinsic region;
a second plug disposed within the encapsulating layer and providing electrical contact between the cathode and the meta contact.

7. The device of claim 6, wherein the first and second plugs comprise Tungsten (W).

8. The device of claim 1, wherein the anode entirely covers a surface of the intrinsic region.

9. The device of claim 1, wherein the anode partially covers a surface of the intrinsic region.

10. The device of claim 1, wherein the first and send plugs comprise a doped N-type material.

11. A method for forming a photodetector device, the method comprising:
implanting an n-type buried layer (NBL) into a substrate layer;
forming a bottom contacting layer over a surface of the substrate layer, the bottom contacting region having a first contacting region and a second contacting region, the bottom contacting layer providing a low resistance path between the first and second contacting regions, the forming of the bottom contacting layer including:
forming an epitaxial (EPI) layer over the surface of the substrate layer and a surface of the NBL;
implanting a first plug into the EPI layer, the first plug in electrical contact with the NBL, the first plug corresponding to the first contacting region; and
implanting a second plug into the EPI layer, the second plug in electrical contact with the NBL, the second plug corresponding to the second contacting region;
depositing an insulating layer over a surface of the bottom contacting layer;
etching a cavity within the insulating layer;
depositing a low band-gap material in the etched cavity of the insulating layer to form an intrinsic region, the intrinsic region in electrical contact with the first contacting region of the bottom contacting layer;
forming a metal contact in the insulating layer, the metal contact in electrical contact with the second contacting region of the bottom contacting layer;
forming an anode to be in electrical contact with the intrinsic region, wherein the anode is offset from the intrinsic region such that at least a portion of the intrinsic region is not covered by the anode; and
forming a cathode to be in electrical contact with thy: metal contact.

12. The method of claim 11, wherein the low band-gap material comprises Germanium (Ge), Silicon-Germanium (SiGe), or Indium Gallium Arsinide (InGaAs).

13. The method of claim 11, wherein the insulating layer comprises an oxide.

14. The method of claim 11, comprising depositing a seed layer over one or more surfaces of the etched region of the insulating layer before depositing a low band-gap material.

15. The method of claim 14, wherein the seed layer has a crystalline structure compatible with the low band-gap material.

16. The method of claim 11, comprising:
forming an encapsulating layer over a surface of the insulating layer;
forming a first plug in the encapsulating layer to provide electrical contact between the anode and the intrinsic region;
forming a second plug in the encapsulating layer to provide electrical contact between the cathode and the metal contact.

17. The method of claim 16, wherein the first and second plugs comprise Tungsten (W).

18. The device of claim 1, wherein the anode is offset from the intrinsic region such that at least a portion of the intrinsic region is not covered by the anode.

19. The method of claim 11, wherein the anode is offset from the intrinsic region such that at least a portion of the intrinsic region is not covered by the anode.

* * * * *